United States Patent
Hoshiya et al.

(10) Patent No.: US 8,564,282 B2
(45) Date of Patent: Oct. 22, 2013

(54) ANGLE SENSOR, ANGLE SENSOR MANUFACTURING METHOD, AND ANGLE DETECTION DEVICE USING THE ANGLE SENSOR

(75) Inventors: Hiroyuki Hoshiya, Odawara (JP); Kenichi Meguroo, Kaisei (JP); Kazuhiro Nakamoto, San Jose, CA (US); Yasunori Abe, Nagaokakyo (JP)

(73) Assignee: Hitachi Metals, Ltd., Tokyo (JP)

( * ) Notice: Subject to any disclaimer, the term of this patent is extended or adjusted under 35 U.S.C. 154(b) by 534 days.

(21) Appl. No.: 12/864,997

(22) PCT Filed: Dec. 3, 2008

(86) PCT No.: PCT/JP2008/071944
§ 371 (c)(1),
(2), (4) Date: Jul. 28, 2010

(87) PCT Pub. No.: WO2009/096093
PCT Pub. Date: Aug. 6, 2009

(65) Prior Publication Data
US 2010/0327857 A1 Dec. 30, 2010

(30) Foreign Application Priority Data

Jan. 30, 2008 (JP) .................................. 2008-019647

(51) Int. Cl.
*G01B 7/30* (2006.01)
(52) U.S. Cl.
USPC ................................... 324/207.25; 29/603.08
(58) Field of Classification Search
USPC ............................ 29/603.01, 603.07, 603.08, 29/603.13–603.14
See application file for complete search history.

(56) References Cited

U.S. PATENT DOCUMENTS

| 5,545,985 | A | * | 8/1996 | Campbell | 324/207.21 |
| 5,545,986 | A | * | 8/1996 | Ariyoshi et al. | 324/207.21 |
| 6,465,053 | B1 | * | 10/2002 | Lenssen et al. | 427/548 |

(Continued)

FOREIGN PATENT DOCUMENTS

| JP | 8-7235 A | 1/1996 |
| JP | 2001-332780 A | 11/2001 |

(Continued)

OTHER PUBLICATIONS

Dexin Wang, Jay Brown, Tim Hazelton, and Jim Daughton, "360 degree Angle Sensor Using Spin Valve Materials With SAF Structure", IEE Transactions on Magnetics, vol. 41, No. 10, pp. 3700-3702.*

*Primary Examiner* — Patrick Assouad
*Assistant Examiner* — Stephen G Armstrong
(74) *Attorney, Agent, or Firm* — Mattingly & Malur, PC

(57) ABSTRACT

There is provided an angle sensor and angle detection device of high output and high accuracy with a wide operating temperature range. First through eighth sensor units 511, 522, 523, 514, 531, 542, 543 and 534 are produced from spin valve magnetoresistive films that use a self-pinned type ferromagnetic pinned layer comprising two layers of ferromagnetic films that are strongly and anti-ferromagnetically coupled. The respective sensor units are produced via the formation and patterning of thin-films magnetized at angles that differ by 90°, and the formation of insulation films. By using, for the ferromagnetic films, CoFe and FeCo films that have similar Curie temperatures to make the difference in magnetization amount be zero, high immunity to external magnetic fields, a broad adaptive temperature range, and high output are realized.

16 Claims, 20 Drawing Sheets

(56) References Cited

U.S. PATENT DOCUMENTS

| | | | |
|---|---|---|---|
| 6,493,196 B1* | 12/2002 | Noma et al. | 360/324.11 |
| 7,852,070 B2* | 12/2010 | Yamada et al. | 324/207.25 |
| 2001/0020847 A1* | 9/2001 | Mattheis et al. | 324/207.21 |
| 2002/0006019 A1 | 1/2002 | Noma et al. | |
| 2004/0246632 A1* | 12/2004 | Nishioka et al. | 360/324.11 |
| 2005/0254289 A1* | 11/2005 | Nakajima et al. | 365/158 |
| 2006/0012922 A1 | 1/2006 | Shoji | |
| 2007/0058301 A1 | 3/2007 | Shimazawa et al. | |
| 2007/0070556 A1 | 3/2007 | Zhang et al. | |
| 2007/0090831 A1* | 4/2007 | Matsumoto et al. | 324/207.25 |
| 2007/0253122 A1 | 11/2007 | Fukuzawa et al. | |

FOREIGN PATENT DOCUMENTS

| | | |
|---|---|---|
| JP | 2002-519873 A | 7/2002 |
| JP | 2002-303536 A | 10/2002 |
| JP | 2003-502674 A | 1/2003 |
| JP | 2004-29007 A | 1/2004 |
| JP | 2004-296000 A | 10/2004 |
| JP | 2006-13181 A | 1/2006 |
| JP | 2006-29900 A | 2/2006 |
| JP | 2007-81126 A | 3/2007 |
| JP | 2007-88483 A | 4/2007 |
| JP | 2007-299880 A | 11/2007 |
| WO | 00/79297 A1 | 12/2000 |

* cited by examiner

FIG. 9
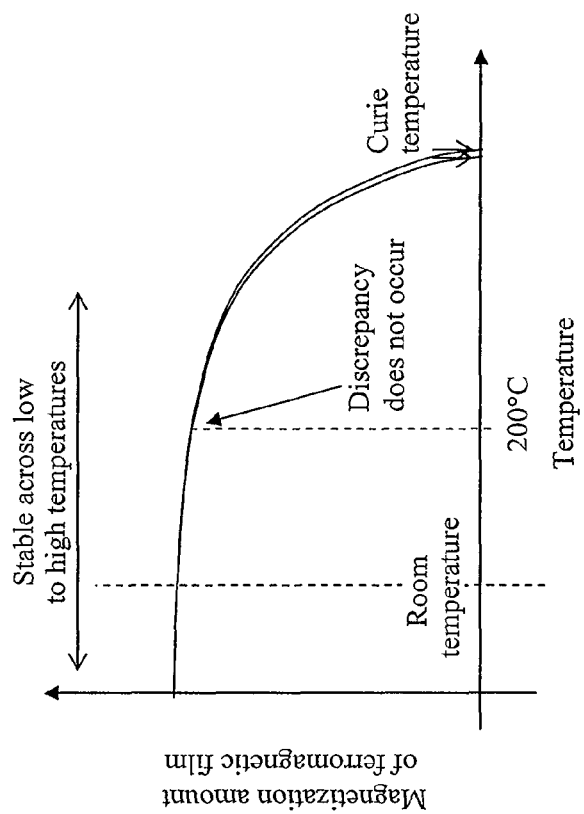
(a)
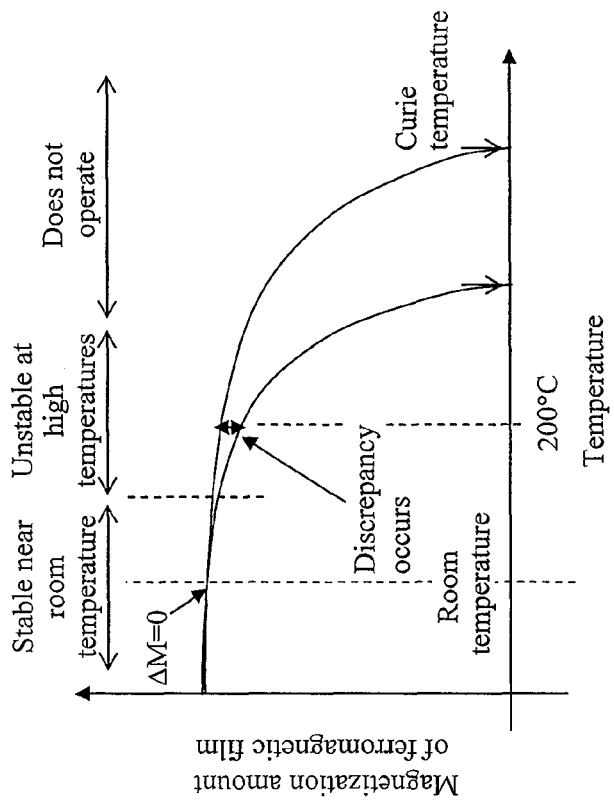
(b)

Sensor unit 1: Hk 6, $H_{int}$ 0
Sensor unit 2: Hk 6, $H_{int}$ 0
Sensor unit 3: Hk 5, $H_{int}$ 0
Sensor unit 4: Hk 5, Hint 0 (In oersteds)
Angle setting misalignment -0.2°

ANGLE SENSOR, ANGLE SENSOR MANUFACTURING METHOD, AND ANGLE DETECTION DEVICE USING THE ANGLE SENSOR

The present application is based on Japanese application JP 2008-19647 filed on Jan. 30, 2008, the content of which is hereby incorporated by reference into this application.

TECHNICAL FIELD

The present invention relates to an angle sensor that uses a magnetoresistive sensor and a manufacturing method thereof, as well as a non-contact angle detection device that uses such an angle sensor.

BACKGROUND ART

Magnetic non-contact angle detection devices are a technology that is used for measuring the angle of a driving body or a rotating body using magnets, magnetic sensors, etc. As magnetoresistive films used in magnetic sensor parts, magnetic thin films having anisotropic magnetoresistive effects, and so-called giant resistance of multilayer films in which ferromagnetic metal layers are stacked with interposed non-magnetic metal layers, or tunnel magnetoresistive effects, etc., are known. As a similar technology used as read sensors of magnetic heads, there is the spin valve film, and this is known as a technology with which giant magnetoresistive effects can be achieved with good sensitivity. A spin valve film comprises a ferromagnetic pinned layer whose magnetization is substantially pinned relative to the magnetic field to be detected, and a soft magnetic free layer whose magnetization rotates smoothly relative to the magnetization to be detected, wherein an electrical signal corresponding to the relative angle between both magnetizations is outputted.

Patent Document 1: JP 2002-303536 A
Patent Document 2: JP 2003-502674 A
Patent Document 3: JP 2002-519873 A
Patent Document 4: JP 8-7235 A
Patent Document 5: JP 2004-296000 A
Non-Patent Document 1: Appl. Phys., vol. 83, pp. 3720-3723

DISCLOSURE OF THE INVENTION

Problems to be Solved by the Invention

Sensors that use the magnetoresistive effect have been considered as angle sensors for use in angle detection devices. However, with conventional technology, it was difficult to realize stable operation at high temperatures and high accuracy which have been demanded of angle detection devices in recent years.

The drawback in trying to realize stability at high temperatures and high accuracy with magnetoresistive sensors in relation to conventional angle detection devices lies in the fact that they are limited to the stability at high temperatures of the spin valve film. While spin valve films are an important technology for angle detection devices in realizing high output, one essential factor for their application as angle sensors is the pinning of the magnetization of the ferromagnetic pinned layer thereof. In order for a spin valve film to detect the angle of a magnetic field that is applied, an output relative to the direction in which the magnetization of the ferromagnetic pinned layer is pinned is necessary. Generally, in technology that is referred to as spin valve films, this pinning of the magnetization of a ferromagnetic pinned layer is performed by stacking an anti-ferromagnetic film on the ferromagnetic pinned layer, and pinning the magnetization direction with the generated exchange coupling. Patent Document 1 discloses a rotation angle detection sensor in which a pinned magnetic layer has its magnetization pinned by an anti-ferromagnetic film.

Such pinning of the magnetization direction by an anti-ferromagnetic film is a well-known method for the above-mentioned spin valve films, and for tunnel magnetoresistive elements using similar principles. Just as there is the Néel temperature for an anti-ferromagnet, there is an upper limit temperature for the above-mentioned exchange coupling which is called the blocking temperature, and once this temperature is reached, the exchange coupling in effect vanishes. Further, the exchange coupling decreases as the temperature approaches the blocking temperature. Even below the blocking temperature, at temperatures close thereto, the exchange coupling becomes insufficient, and the function of the spin valve film as an angle sensor becomes lost, being unable to exhibit sufficient accuracy. This phenomenon applies not only to cases where a spin valve film is used for an angle sensor, but also to cases where a tunnel magnetoresistive film or a CPP-GMR (current-perpendicular-to-plane giant magnetoresistive) film is used as long as an exchange coupling caused by an anti-ferromagnetic film is applied. Examples of anti-ferromagnetic films widely in application include MnPt films and MnIr films, but their blocking temperatures are approximately 320° C. and 250° C., respectively, and they do not allow for application in angle detection devices at such high temperatures as 200° C., for example. This is because even if the blocking temperature is not reached, if a condition is sustained for extended periods where a magnetic field is applied under a 200° C. environment, the exchange coupling caused by the anti-ferromagnetic film will gradually lose the one directional anisotropy that had been set.

On the other hand, as other methods of pinning magnetization that have similar effects to those of cases where an anti-ferromagnetic film is used, there are a method that uses a magnetic film that is magnetized in the manner in Patent Document 2, and a method that is referred to as an AAF system (Artificial Anti-Ferromagnetic system) as disclosed in Patent Document 3 where there are used stacked magnetic films that create a state in which coercive force is substantively enhanced by anti-ferromagnetic coupling. With regard to sensors that use the above-mentioned anti-ferromagnetically coupled magnetic films, Patent Documents 4 and 5 contain descriptions on magnetic sensors and magnetic heads. These methods are achieved basically by performing a magnetizing treatment with respect to a thin film of a ferromagnetic material, and by taking the direction of the remanence magnetization as a reference for the operating angle of the sensor. Patent Document 3 discloses a technology that uses a ferromagnetic layer for which a magnetic field is applied at the time of a sensor's thin film formation, and which is pinned in this direction.

For spin valve films for application in magnetic heads, the technologies disclosed in Patent Documents 4 and 5 and Non-Patent Document 1 (also referred to as self-pinned type, artificial anti-ferromagnetic system, etc.) are known as technologies for pinning the magnetization direction without relying on an anti-ferromagnetic film. These are technologies that apply the fact that when, for example, a stacked structure of Co/Ru/Co is formed in and through an appropriate thickness and production method, the two Co layers anti-ferromagnetically and strongly form exchange coupling and, as a result, the magnetizations of the two Co layers in an antiparallel alignment become less susceptible to change by an external magnetic field. Such systems shall herein be referred to as self-pinned type. The Curie temperature of a ferromagnetic metal is generally higher than the blocking temperature of an anti-ferromagnetic film. In Non-Patent Document 1, it is mentioned that magnetoresistive effects were observed even at 275° C. The maximum temperature that would allow for extended use in reality aside, it can be seen that there is potential for realizing high thermal stability.

Thus, thin film configurations of magnetoresistive sensors for realizing angle sensors may be categorized broadly into those that use an anti-ferromagnetic film, those that use a magnetized ferromagnetic film, and those that use anti-ferromagnetically coupled and magnetized stacked magnetic films. On the other hand, while the magnetic anisotropy of the thin films that constitute such angle sensors is determined by the direction of magnetization of the magnetized ferromagnetic film, several methods for such magnetization are known. In Patent Document 1, it is mentioned that the pinning of the magnetization of a pinned magnetic layer is performed through a magnetizing step in which a high-temperature heat treatment is performed over several hours with a magnet block in close proximity. In Patent Document 3, it is mentioned that heaters are provided in close proximity to sensors, certain heat sensors are heated and an external magnetic field is applied, thereby magnetizing those certain sensors. Patent Document 2 discloses a method of pinning by applying a magnetic field at the time of sensor film formation. Further, Patent Document 5 discloses a magnetic field application process at an appropriate room temperature at which the magnetization direction of a pinned layer can be restored to a desired direction.

Further, as a major indicator for placement of the performance of angle sensors, there is angle error. A magnetoresistive angle sensor converts the direction of a magnetic field applied to the sensor into an electric signal, but there exist factors that cause an angle error of a certain magnitude such that the direction of the applied magnetic field is not accurately converted into an electric signal. One such factor that cannot be ignored is the induced magnetic anisotropy of a soft magnetic free layer. The induced magnetic anisotropy of a soft magnetic film generally is such that uniaxial anisotropy is caused so that the direction in which a magnetic field is applied during thin film formation becomes the magnetic easy axis. Further, with extremely thin soft magnetic films in particular, such as spin valve films, it is known that the direction of the induced magnetic anisotropy changes to the direction of magnetization during heat treatment. The magnetization of the soft magnetic free layer stabilizes in a direction that minimizes static magnetic energy with respect to the magnetic field to be detected and the induced magnetic anisotropy. Therefore, when the induced magnetic anisotropy of the soft magnetic free layer is not zero, such magnetic anisotropy that is present in the soft magnetic free layer becomes an impediment for the magnetization of the soft magnetic free layer to become completely parallel with the magnetic field to be detected. The magnetic anisotropy of a ferromagnetic thin film is a material-specific physical property. To put it simply, by virtue of the presence of the induced magnetic anisotropy of the soft magnetic free layer, the electric output of the angle sensor is misaligned with the direction of the actual magnetic field to be detected by a certain angle error.

What is even more difficult is that, with respect to magnetoresistive angle sensors, the fact that it is necessary to set the anisotropy of the ferromagnetic pinned layer and the fact that it is better that there be no induced magnetic anisotropy of the soft magnetic free layer are mutually incompatible. In other words, when, as in Patent Document 2, a ferromagnetic pinned layer of a magnetoresistive film that forms an angle sensor is magnetized and formed by applying a uniform magnetic field to a substrate at the time of thin film formation, because the same magnetic field is also applied to a soft magnetic free layer, induced magnetic anisotropy whose magnetic easy axis is in the same direction is caused in the soft magnetic free layer. Similarly, when, as in Patent Document 3, a ferromagnetic pinned layer is magnetized for a desired sensor unit that is heated by a heater, the induced magnetic anisotropy of the soft magnetic free layer is simultaneously heat treated within a magnetic field and rotates in the same direction. Thus, there is appropriate anisotropy for each of the ferromagnetic pinned layer and the soft magnetic free layer, and independent control thereof could not be realized with conventional technology.

An object of the present invention is to provide a magnetoresistive angle sensor that is capable of realizing high magnetoresistive effects, broad operational temperatures, and a small angle error, as well as an angle detection device using the same.

Means for Solving the Problems

In the present invention, an angle sensor that detects the direction of a magnetic field comprises plural sensor units comprising a self-pinned type spin valve film. The plural sensor units constitute a bridge circuit, and the plural sensor units are formed on the same substrate with varied magnetization directions for the self-pinned type ferromagnetic pinned layer so that they would perform detections of mutually differing phases, that is, relative angles, with respect to a given magnetic field direction. The self-pinned type ferromagnetic pinned layer comprises first and second ferromagnetic films, and an anti-parallel coupling layer that anti-ferromagnetically couples the two, and the first and second ferromagnetic films are composed of materials having roughly the same Curie temperature and which exhibit roughly the same magnetization amount and increase/decrease behavior thereof with respect to changes in temperature of from −50° C. to 150° C., namely, a Fe—Co alloy and a Co—Fe alloy. The magnetization amounts of the first and second ferromagnetic films, that is, the product of saturation magnetization and thickness, are set so as to be substantially the same and so that the difference between the magnetization amounts of the two would be zero. The angle sensor has a layered structure of insulation films that are stacked several times in the film thickness direction on the substrate, and the plural sensor units are each disposed on a different layer.

More specifically, an angle sensor of the present invention has a layered structure in which plural magnetoresistive sensor units are stacked in the film thickness direction with interposed insulation films. Each sensor unit comprises: a ferromagnetic pinned layer, wherein a first ferromagnetic film and a second ferromagnetic film are anti-ferromagnetically coupled via an anti-parallel coupling film; a nonmagnetic intermediate layer; and a soft magnetic free layer. The first ferromagnetic film and the second ferromagnetic film have substantially the same Curie temperature, and the difference in their magnetization amounts is effectively zero. The magnetizations of the ferromagnetic pinned layers of the sensor units belonging to different layers are oriented in mutually differing directions. A bridge circuit that outputs a signal corresponding to an external magnetic field by way of plural sensor units is built. If plural sensor units are provided on one layer, the magnetizations of the ferromagnetic pinned layers of the sensor units belonging to the same layer are oriented in the same direction.

As bridge circuits, there are: a first bridge circuit into which are built a sensor unit whose direction of magnetization of the ferromagnetic pinned layer is in a first direction and a sensor unit whose direction of magnetization of the ferromagnetic pinned layer is in the antiparallel direction thereto; and a second bridge circuit into which are built a sensor unit whose direction of magnetization of the ferromagnetic pinned layer is in a second direction that is orthogonal to the first direction and a sensor unit whose direction of magnetization of the ferromagnetic pinned layer is in the antiparallel direction thereto.

The induced magnetic anisotropy of the soft magnetic free layers of the plural sensor units is, in effect, caused to vanish. The induced magnetic anisotropy is caused to vanish by, for example, performing a heat treatment at and over a predetermined temperature and period within a rotating magnetic field or within zero magnetic field after the bridge circuits of the angle sensor are formed.

Effects of the Invention

According to the present invention, it is possible to realize an angle sensor having a high magnetoresistive effect, a wide operating temperature, and a small angle error. By using this in an angle detection device, it is possible to realize an angle detection device with high sensitivity, high accuracy and a wide operating temperature range.

BRIEF DESCRIPTION OF DRAWINGS

FIG. 9(a)-(b) is a conceptual diagram showing the temperature dependence of magnetization amount.

DESCRIPTION OF SYMBOLS

Figure 1:
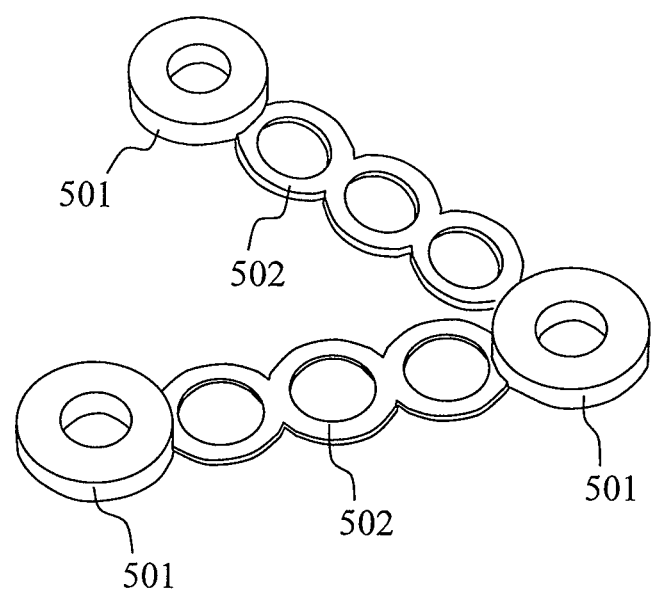
FIG. 1 is a diagram showing a configuration example of a sensor unit constituting an angle sensor of the present invention.

10 Magnetoresistive film
12 Nonmagnetic intermediate layer
13 Soft magnetic free layer
14 Underlayer
15 Ferromagnetic pinned layer
151 First ferromagnetic film
152 Second ferromagnetic film
154 Anti-parallel coupling layer
17 Protection film
41 Insulation film
42 Insulation film
43 Insulation film
44 Insulation film
50 Substrate
501 Electrode terminal
502 Magnetoresistive film pattern wiring
503 Through-electrode terminal
511 First sensor unit
522 Second sensor unit
523 Third sensor unit 514 Fourth sensor unit
531 Fifth sensor unit
542 Sixth sensor unit
543 Seventh sensor unit
534 Eighth sensor unit
55 Angle sensor
61 Magnet
62 Rotary drive shaft
63 Rotary drive body

BEST MODE FOR CARRYING OUT THE INVENTION

Thin films that form a giant magnetoresistive film stack of a magnetic sensor of a magnetic encoder device of the present invention were produced in the following manner with a DC magnetron sputtering device. They were produced by successively stacking the following materials on a substrate within a 0.2- to 3-mTorr atmosphere of argon. As sputtering targets, targets of tantalum, a nickel-iron-chromium alloy, a nickel-iron alloy, copper, Co, Fe, and ruthenium were used. The film stack is such that each layer was successively formed by generating plasmas within the device in advance by applying a DC power to each cathode at which each target was disposed, and opening/closing a shutter disposed at each cathode.

At the time of film formation, a magnetic field of approximately 6 kA/m (80 Oe) was applied parallel to the substrate using a permanent magnet to magnetize a ferromagnetic pinned layer, and the induced magnetic anisotropy of a soft magnetic free layer was applied. The magnetic easy axis of the induced magnetic anisotropy of the soft magnetic free layer was made to be orthogonal to the magnetization direction of the ferromagnetic pinned layer. The formation of elements on the substrate was done by patterning through a photoresist process. A plurality of sensor units were produced in layers with the formation of insulation films therebetween. After the formation of an angle sensor element, in order to cause the induced magnetic anisotropy of the soft magnetic free layer to vanish, a heat process at 200 to 250° C. and over three hours was performed within a rotating magnetic field or within a zero magnetic field.

EXAMPLE 1

A configuration example of the basic structure of a sensor unit forming an angle sensor of the present invention is shown in FIG. 1. The basic structure of the sensor unit comprises magnetoresistive film pattern wiring 502 and electrode terminals 501. The magnetoresistive film pattern wirings 502 are formed in a predetermined shape through a photolithography process, and a chain-like shape example where current flows in the direction in which rings are linked is shown in this figure. The patterned shape for the magnetoresistive film pattern wirings 502 is formed for the purpose of defining a current path of a width and length and a direction that would result in a desired value for the electrical resistance of the sensor unit. The chain-like pattern has an effect where the directionality of the conducted current is dispersed/homogenized. However, even if it were not chain-like as in the example in this figure, it would not depart from the spirit of the present invention. For example, it may be arranged in a folded structure, a corrugated or a helical structure. The electrode terminals 501 are for passing an electric current through the magnetoresistive film pattern wirings 502, and are provided to electrically connect with adjacent magnetoresistive film pattern wirings, sensor units, or other electrode terminals and wirings. In FIG. 1, the electrode terminals 501 are shown as if they have greater width in the thickness direction than the magnetoresistive film pattern wirings 502. However, as will be discussed later, by forming them in such a manner as to penetrate in the thickness direction, the electrode terminals 501 may be given the function of electrical connection in the thickness direction.

Figure 2:
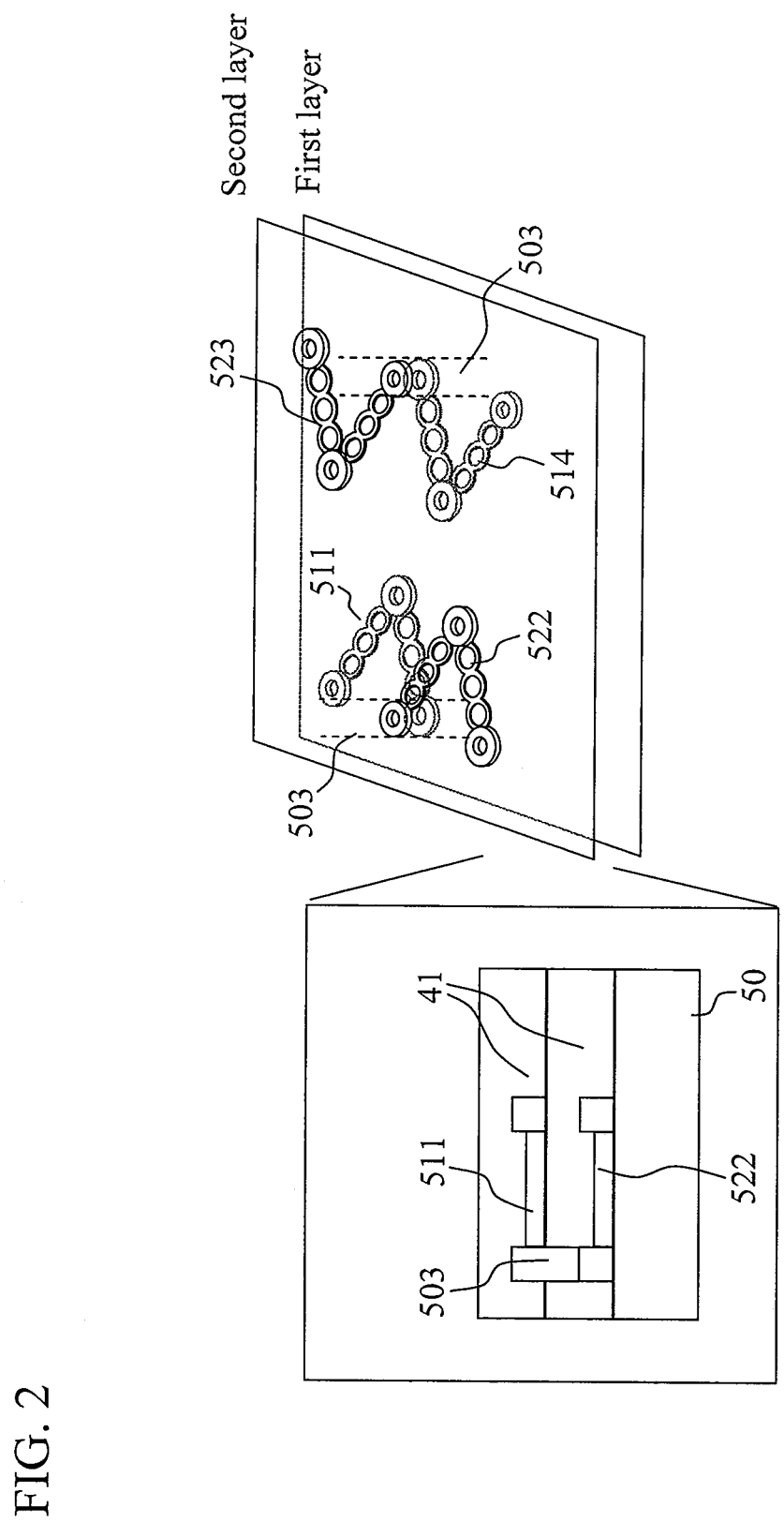
FIG. 2 is a diagram showing a conceptual view of a stack configuration of an angle sensor of the present invention.

A conceptual view of the stack configuration of an angle sensor of the present invention is shown in FIG. 2. Here, for purposes of brevity, there is shown a stack configuration comprising four sensor units, namely, a first sensor unit 511, a second sensor unit 522, a third sensor unit 523, and a fourth sensor unit 514, and electrical wiring is shown partially omitted.

In the diagram on the right in FIG. 2, magnetoresistive film pattern wirings that form the first sensor unit 511 and the fourth sensor unit 514 are formed on a first layer. An insulation film 41 is formed between the first layer and a second layer. Magnetoresistive film pattern wirings that form the second sensor unit 522 and the third sensor unit 523 are formed on the second layer. Through-electrode terminals 503 are electrode terminals that connect the layers in such a manner as to electrically connect electrode terminals located at overlapping positions on different layers as indicated with the broken lines.

A schematic view of the cross-sectional structure is shown on the left in FIG. 2. Although electrode terminals are drawn on respective layers in the figure, they may also be formed as a single through-electrode without departing from the spirit of the present invention. In the present invention, it is assumed that sensor units that have magnetoresistive film pattern wirings on the same layer are magnetized in the same direction, and sensor units that have magnetoresistive film pattern wirings formed on different layers are magnetized at different angles, e.g., in directions that differ by 90° or 180°.

One feature of the configuration of the present invention lies in the fact that the area surrounding each sensor unit is occupied by the magnetoresistive film pattern wiring itself that forms the sensor unit, the electrode terminal and the insulation film 41. Unlike a case where, as in Patent Document 3, the configuration is such that, adjacent above/below (in the thickness direction) or in the width direction to the magnetoresistive film wiring that forms a sensor unit, there is disposed a heater, whose purpose is to heat and magnetize the sensor unit, or a magnet film that applies a magnetic field, in the present invention, there are no excess features besides the requisite magnetoresistive films, electrodes and insulation films. Thus, a magnetic sensor of the present invention has advantages in that it is simple in structure and easy to produce, occurrences of such anomalies as surface corrosion of metal films/insulation films are suppressed, and it can be manufactured at low costs.

Figure 3:
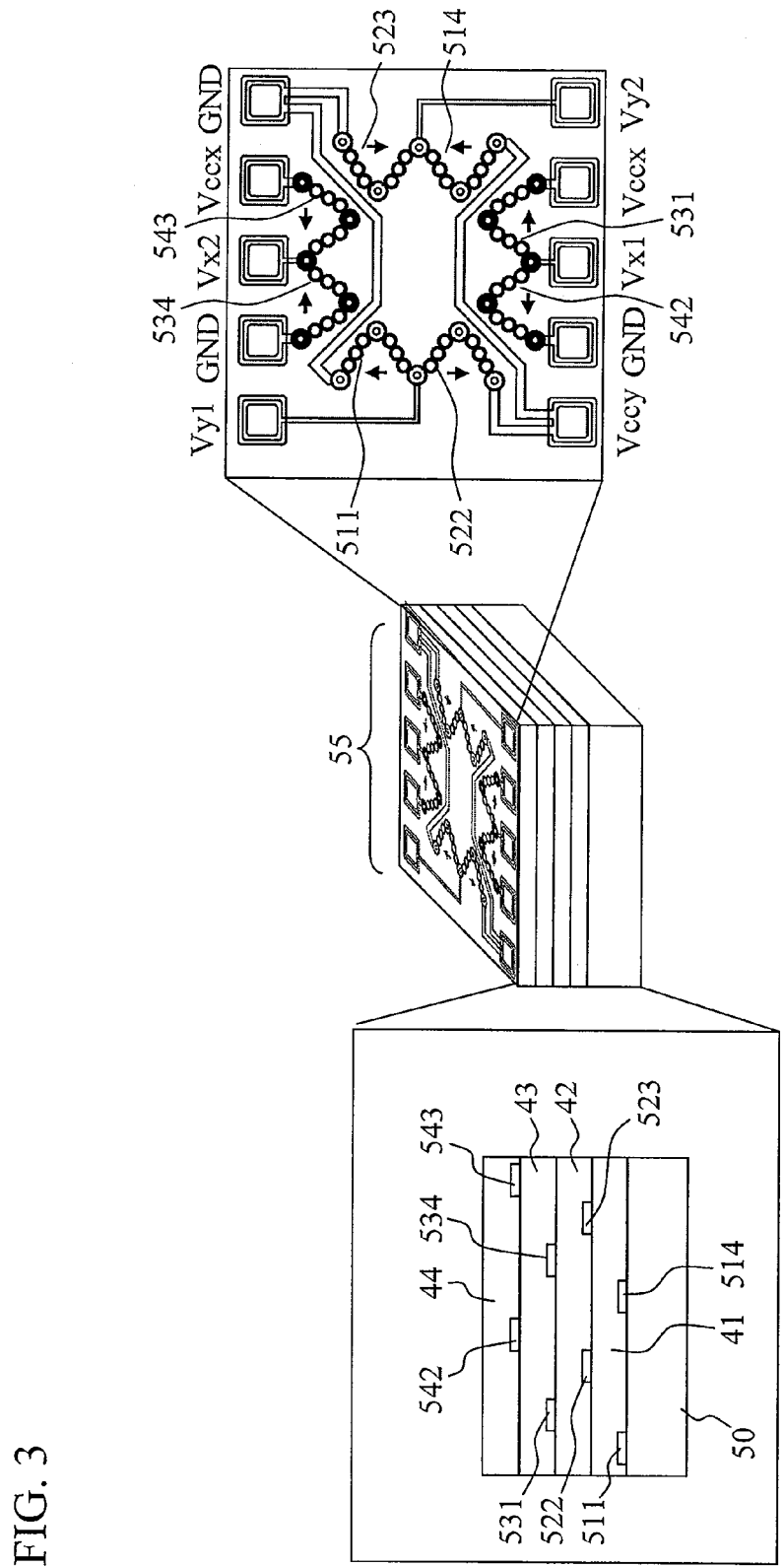
FIG. 3 is a diagram showing the structure of a representative angle sensor of the present invention.

The structure of a representative angle sensor of the present invention is shown in FIG. 3. The diagram on the left side of FIG. 3 is a diagram showing the cross-sectional structure. Here, for purposes of brevity, illustration has been omitted with respect to the structure of the electrode terminals. On a substrate 50, first, second, third, fourth, fifth, sixth, seventh, and eighth sensor units 511, 522, 523, 514, 531, 542, 543, and 534 are so formed as to be electrically separated via insulation films 41, 42, 43, and 44 to be divided into four parts in a layered structure. Assuming that the first through fourth sensors constitute sensors magnetized in the Y direction, the fifth through eighth sensors constitute X-direction sensors, which have a directionality that is orthogonal to the Y direction in an in-plane direction. This will be discussed later in the description for FIG. 4. Appropriately combining the signals of these X- and Y-direction sensors, it is possible to obtain angle information across 360° as one angle sensor. Here, in the figure, Y-axis sensor elements, Y-axis sensor elements, X-axis sensor elements, and X-axis sensor elements were configured in order from bottom up in four layers, but this order may be altered without departing from the spirit of the present invention.

Through the above-mentioned layered configuration, it is possible to form each sensor unit as an isolated circuit that is electrically insulated, and the formation process for each sensor unit can be performed separately in stages, thereby making it possible to define independent magnetization directions.

The diagram on the right side of FIG. 3 is a view as seen from the direction of the surface of the substrate. There is shown an example where one chain-like V-shaped portion is one sensor unit. The first, second, third and fourth sensor units 511, 522, 523 and 514 are electrically connected to a ground electrode (GND), a first output voltage electrode ($V_{y1}$), a second output voltage electrode ($V_{y2}$), and an applied voltage electrode ($V_{ccy}$) via appropriate electrode terminals and leads, thus forming a bridge of a Y-axis sensor element. While a bridge circuit example of a sensor unit is shown in this diagram, the connection state and connection method thereof is by no means limited to the structure of this example in particular. In order to suppress the position dependence of detected magnetic fields, the eight sensor units are formed in a proximal arrangement on a single substrate. Alternatively, effects may be obtained to some extent by forming two (or four) sensor units in a proximal arrangement on a single substrate, and forming them by joining four (two) of these.

In the configuration example in FIG. 3, the first through fourth sensor units each have a specific anisotropy as discussed later so that they each produce an output of a different angle with respect to the direction of the applied magnetic field. The arrows in the diagram on the right in FIG. 3 show examples thereof, where the first sensor unit 511 and the second sensor unit 522, as well as the third sensor unit 523 and the fourth sensor unit 514, are produced as pairs having two directionalities that mutually differ by 180° each. Similarly, the fifth, sixth, seventh and eighth sensor units 531, 542, 543 and 534 are electrically connected to ground electrodes (GND), a first output voltage electrode ($V_{x1}$), a second output voltage electrode ($V_{x2}$), and applied voltage electrodes ($V_{ccx}$) via appropriate electrode terminals and leads, thus forming an X-axis bridge. The magnetization directions of the fifth, sixth, seventh and eighth sensor units 531, 542, 543 and 534 are, for example, as indicated by the arrows in the diagram, where the fifth sensor unit 531 and the sixth sensor unit 542, as well as the seventh sensor unit 543 and the eighth sensor unit 534, are produced as pairs having two anisotropies that mutually differ by 180° each in directions that differ from the first through fourth sensor units by plus or minus 90°.

Figure 4:
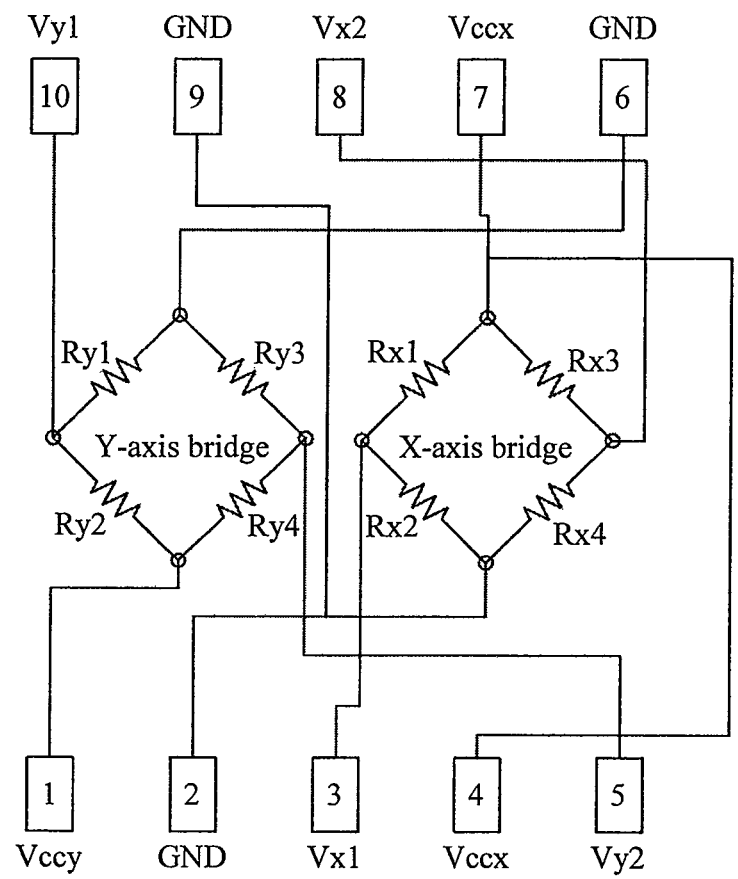
FIG. 4 is a diagram showing a circuit example of an angle sensor of the present invention.

A circuit example of an angle sensor of the present invention is shown in FIG. 4. The first, second, third, fourth, fifth, sixth, seventh and eighth sensor units 511, 522, 523, 514, 531, 542, 543 and 534 respectively behave as electrical resistors $R_{y1}$, $R_{y2}$, $R_{y3}$, $R_{y4}$, $R_{x1}$, $R_{x2}$, $R_{x3}$ and $R_{x4}$. The first through eighth sensor units form two so-called full-bridge circuits, and by inputting voltages to $V_{ccy}$ and $V_{ccx}$, a Y-bridge output $V_{y1}$-$V_{y2}$ and an X-bridge output $V_{x1}$-$V_{x2}$ are outputted. Due to the magnetoresistive effect, each sensor unit produces an output of cosine waveform with respect to the relative angle between the magnetization direction and the direction of the magnetic field to be detected. Thus, from the outputs of the Y bridge and the X bridge, whose magnetization angles are mutually varied by 90°, it is possible to calculate the direction of the magnetic field to be detected. Here, the full-bridge circuits are capable of attaining an effect whereby changes in the electrical resistance due to temperature changes are compensated for by obtaining outputs from a sensor unit pair having the same magnetization direction, e.g., $R_{y1}$ and $R_{y4}$, and from a sensor unit pair whose magnetization direction differs by 180°, e.g., $R_{y2}$ and $R_{y3}$.

Figure 5:
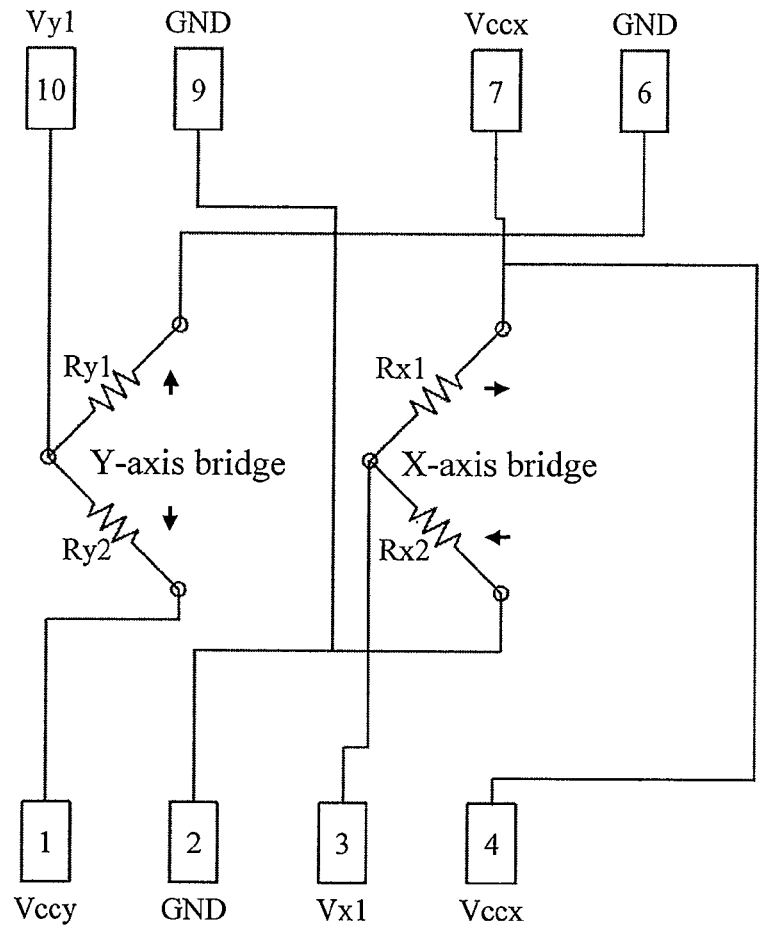
FIG. 5 is a diagram showing another circuit example of an angle sensor of the present invention.

Another circuit example of an angle sensor of the present invention is shown in FIG. 5. The four sensor units that constitute electrical resistors $R_{y1}$, $R_{y2}$, $R_{x1}$ and $R_{x2}$ have mutually differing magnetization directions as in the ferromagnetic pinned layer magnetization direction example shown in the diagram. These four sensor units with differing magnetization directions form two so-called half-bridge circuits, and by inputting voltages to $V_{ccy}$ and $V_{ccx}$, a Y-bridge output $V_{y1}$ and an X-bridge output $V_{x1}$ are outputted. Due to the magnetoresistive effect, each sensor unit produces an output of cosine waveform with respect to the relative angle between the magnetization direction and the direction of the magnetic field to be detected. Thus, from the outputs of the Y bridge and the X bridge, whose magnetization angles are mutually varied by 90°, it is possible to calculate the direction of the magnetic field to be detected.

In the above-mentioned FIG. 3, FIG. 4 and FIG. 5, there are shown configurations in which the magnetization directions of the respective sensor units are varied by 90° each. However, this is simply for geometric reasons. Specifically, in covering 360° by combining a plurality of sensors having outputs of cosine waveform in order to create a 360° sensor operating capacity, it is most efficient to do so with angles divided in four parts, i.e., every 90°. This is because a cosine curve has crests or troughs at angular widths of 90°. Strictly speaking, it is also possible by dividing it, for example, in six parts, i.e., every 60° instead of 90°. Further, it is also possible in principle, although at the risk of a slight drop in efficiency, to configure it in a four-part division albeit at 70°, 180°, 250° and 360° instead of precisely every 90°.

Figure 6:
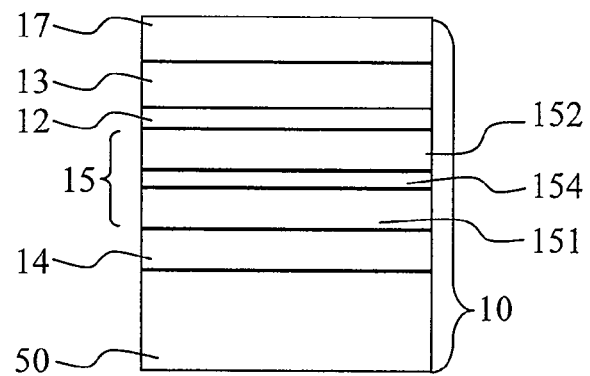
FIG. 6 is a diagram showing a configuration example of a magnetoresistive film stack of a sensor unit of the present invention.

The configuration of a magnetoresistive film stack 10 of a representative sensor unit of the present invention is shown in FIG. 6. It comprises on a substrate 50: an underlayer 14; a first ferromagnetic film 151; an anti-parallel coupling layer 154; a second ferromagnetic film 152; a nonmagnetic intermediate layer 12; a soft magnetic free layer 13; and a protection film 17. Of the above, the first ferromagnetic film 151 and the second ferromagnetic film 152 are so formed that they are strongly coupled anti-ferromagnetically via the anti-parallel coupling layer 154, and that their magnetizations are in an anti-parallel state. This portion is such that its magnetization direction is effectively fixed relative to external magnetic fields, and functions as a ferromagnetic pinned layer 15. As the level of electrical conductivity via the nonmagnetic intermediate layer 12 changes in accordance with the relative angle difference in magnetization directions between the ferromagnetic pinned layer 15, whose magnetization direction does not change in response to an external magnetic field, and the soft magnetic free layer 13, which rotates the magnetization direction well in response to an external magnetic field, the magnetoresistive effect is generated and a signal output is obtained. In other words, the reference for the angle of each sensor unit relative to the magnetic field direction to be detected is determined by the pinned magnetization direction of the above-mentioned ferromagnetic pinned layer 15.

Next, a more detailed configuration of a magnetoresistive film stack of a sensor unit of the present invention is discussed.

Figure 7:
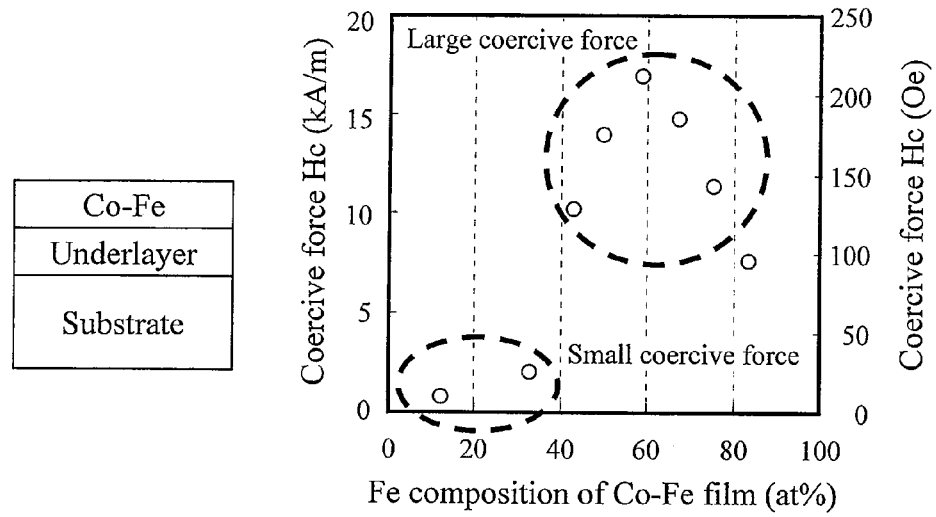
FIG. 7 is a diagram showing the relationship between the coercive force and Fe composition of a Co—Fe film formed on an underlayer.

FIG. 7 is a diagram showing the relationship between the coercive force and Fe composition of a Co—Fe film formed on an underlayer. It can be seen that the coercive force of the Co—Fe film changes significantly with respect to the composition of the Co—Fe film. It can be seen that at the region where Fe composition is less than 40 at. %, the coercive force of the Co—Fe film is small, namely, 4 kA/m (50 Oe) or less, and magnetization rotates relatively easily. On the other hand, at an Fe composition of 40-80 at. % (i.e., Fe-20 to 60 at. % Co), it can be seen that coercive force becomes large, namely, 8 kA/m (100 Oe) or greater, and it becomes resistant to the rotation of magnetization. As such, for a sensor unit of an angle sensor of the present invention, it is preferable to use a thin film of Fe-20 to 60 at. % Co as the first ferromagnetic film. A sensor unit for use in an angle sensor of the present invention thus exhibits high stability with respect to external magnetic fields, while making it possible to realize ease of magnetization that determines anisotropy, as well as a high output. It is preferable to use a thin film of Co-0 to 40 at. % Fe as the second ferromagnetic film.

As can be seen from FIG. 7, by adopting such a composition, it is possible to keep the coercive force of the second ferromagnetic film at a smaller value as compared to the first ferromagnetic film, and it is consequently possible to enhance the magnetic stability of the ferromagnetic pinned layer. With respect to these ferromagnetic films, which are mutually strongly coupled ferromagnetically via the anti-parallel coupling layer, making the coercive force of the second ferromagnetic film be smaller relative to the coercive force of the first ferromagnetic film produces a function whereby the magnetization direction of the first ferromagnetic film, whose coercive force is greater, is given priority, and ultimately makes it possible to enhance the stability of the magnetization of the ferromagnetic pinned layer. In addition, since the second ferromagnetic film is directly adjacent to the intermediate layer in structure and is to serve the function of producing magnetoresistive effects, in deciding on the composition, it is also possible to choose a composition that would provide for high magnetoresistive effects. In particular, by using a thin film of Co-10 at. % Fe, it is possible to simultaneously attain high magnetization stability and a high magnetoresistance ratio.

Figure 8:
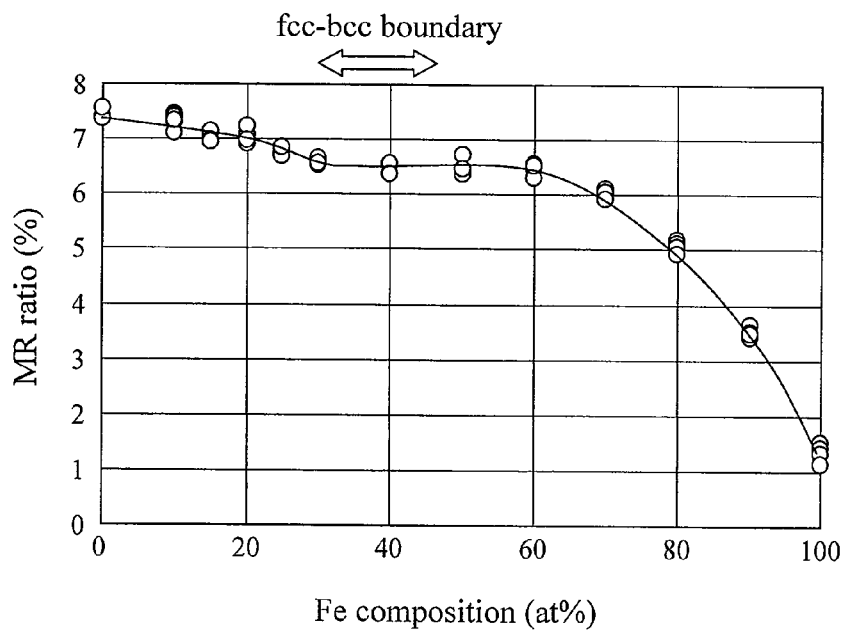
FIG. 8 is a reference diagram showing the dependence of the magnetoresistive effect on Co—Fe composition.

FIG. 8 shows reference data indicating the Co—Fe composition dependence of the magnetoresistive effect. The data are experiment results for a film of the following structure: substrate/underlayer/MnPt film/Co-10 at. % Fe film/Ru film/Co-10 at. % Fe film/Co—$Fe_x$ film/Cu film/Co-10 at. % Fe film/Ni-20% Fe film/protection film. Although it is not the same as the self-pinned type spin valve of the present invention, since the physical mechanism of generating giant magnetoresistance is the same, it provides some guidance as a finding regarding the composition of Co—Fe ferromagnetic films.

From FIG. 8, it can be seen that when the composition of the Co—$Fe_x$ part is changed, the MR ratio gradually decreases as Fe composition increases. When Fe composition is made to be 30 at. % or greater, this corresponds to the boundary of fcc/bcc structure of Co—Fe alloys. However, it can be seen that the MR ratio drops significantly in this composition region. It is speculated that when the Co—Fe thin film becomes a bcc structure, there arises a crystallographic mismatch with other layers that generate the giant magnetoresistive effect, that is, fcc structure layers such as the Cu nonmagnetic intermediate layer and the CoFe/NiFe soft magnetic free layer, and this becomes an electron scattering factor to cause a drop in magnetoresistance. The MR ratio drops further as Fe is further increased. The fact that the combination of Fe/Cu has a smaller giant magnetoresistive effect than the combination of Co/Cu is thought to be similar to phenomena that have been reported in academic papers and the like. For such reasons, it is preferable that a second ferromagnetic film of the present invention be a Co—Fe thin film where the Fe composition is in the range of 40 at. % or below or, further, 20 at. % or below, where it is particularly preferable that it be approximately 10 at. %.

Another reason for using a first ferromagnetic film and a second ferromagnetic film of such compositions for a magnetoresistive film for use in a sensor unit of the present invention is the property of temperature dependence for achieving the functionality of being operational across a wide temperature range, which is an object of an angle sensor of the present invention. In general, the magnetization of a ferromagnet decreases due to thermal fluctuation caused by a rise in temperature, and the thermal properties thereof are determined by the Curie temperature of that material. As is well-known, the Curie temperature is 770° C. for Fe, 1120° C. for Co, and 358° C. for Ni. If, hypothetically, a self-pinned type ferromagnetic pinned layer were produced with layers of Fe and Co, the saturation magnetic flux densities at room temperature would respectively be approximately 2.1 T, and 1.6 T. Therefore, by setting the thickness of the Fe layer and the thickness of the Co layer so as to be 1.6:2.1 so that the difference in magnetization amount therebetween would be zero, the difference in magnetization amount can be made more or less zero. However, because the Curie temperatures are different between Fe and Co, as temperature rises, their magnetization amounts decrease in a Brillouin function-like manner and, consequently, the difference in magnetization amount between the magnetizations gradually shifts away from zero.

A diagram that conceptually indicates the temperature dependence of magnetization amount is shown in FIG. 9. FIG. 9(a) is a diagram indicating the properties of a self-pinned type ferromagnetic pinned layer that uses ferromagnetic films with differing Curie temperatures. FIG. 9(b) is a diagram indicating the properties of a self-pinned type ferromagnetic pinned layer that uses ferromagnetic films with comparable Curie temperatures.

When ferromagnetic films with differing Curie temperatures are used, as shown in FIG. 9 (a), due to the difference in the Curie temperature, magnetization amount difference ΔM at 200° C. shifts further away from zero and, as a result, the ferromagnetic pinned layer becomes unstable with respect to external magnetic fields. This phenomenon follows the same principles as those used in the magnetization of a ferromagnetic pinned layer by heating or cooling in Patent Document 3, but an object of the present invention lies in the provision of an angle sensor that is stable with respect to a rise in temperature by adopting a structure in which this phenomenon is instead suppressed. According to "Ferromagnetism" by R. M. Bozorth (D. Van Nostrand Co. Inc., N.Y., (1951)), $Fe_{40}Co_{60}$ has a phase transformation point around 980° C. and loses magnetism, but the "virtual" effective Curie temperature that is extrapolated from the low temperature side is approximately 1,140° C. This temperature is extremely close to the Curie temperature of Co, namely, 1,120° C. Such properties indicate that Co and $Fe_{40}Co_{60}$ effectively have roughly comparable temperature dependence of magnetization. These two compositions are close to those of the above-mentioned first and second ferromagnetic films of the present invention. Therefore, based on their alloy compositions, first and second ferromagnetic films of the present invention may both be expected to have comparable Curie temperatures around 1,100° C., and to have similar temperature dependence of magnetization with respect to a rise in temperature. On the other hand, FIG. 9(b) shows a conceptual diagram of the thermal properties of the magnetization of a ferromagnetic pinned layer of magnetoresistive films for use in a sensor unit of the present invention. By forming a ferromagnetic pinned layer from materials with comparable Curie temperatures, it is possible to obtain a magnetoresistive film for use in a sensor unit where ΔM is near zero across a wide temperature range, and to realize an angle sensor that operates stably at low temperatures and high temperatures alike.

Figure 10:
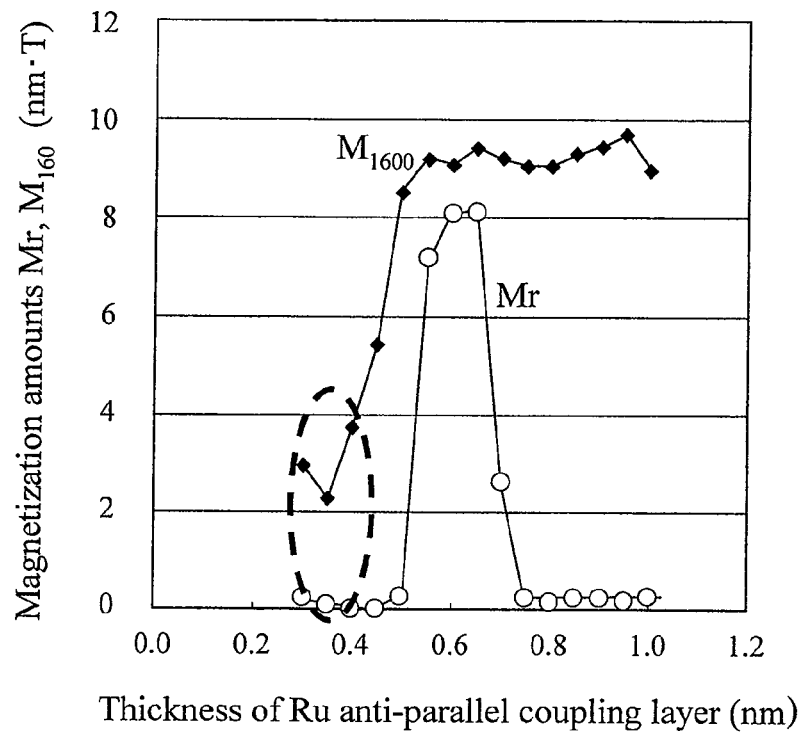
FIG. 10 is a diagram showing remanence magnetization amount Mr when Ru is used as an anti-parallel coupling layer in a ferromagnetic pinned layer, and magnetization amount $M_{1600}$ at a magnetic field of 1600 kA/m (20 kOe).

Remanence magnetization amount Mr and magnetization amount $M_{1600}$ at a magnetic field of 1600 kA/m (20 kOe) in a case where Ru is used as the anti-parallel coupling layer for the ferromagnetic pinned layer are shown in FIG. 10. Remanence magnetization amount Mr becomes greater as the thickness of the Ru anti-parallel coupling layer approaches 0.6 nm, and is almost zero when the thickness of Ru is 0.3-0.45 nm or 0.7-1 nm. This indicates that the anti-ferromagnetic coupling force between the first ferromagnetic film and the second ferromagnetic film that form the ferromagnetic pinned layer changes with Ru thickness. Specifically, when the thickness of the Ru anti-parallel coupling layer is 0.3-0.45 nm or 0.7-1 nm, the anti-ferromagnetic coupling is good, but when the thickness of the Ru anti-parallel coupling layer is in the vicinity of 0.6 nm, it is ferromagnetic, as a result of which the remanence magnetization component increases. Next, turning to $M_{1600}$, which is the magnetization amount at an applied magnetic field of 1600 kA/m (20 kOe), it can be seen that it decreases when the thickness of the Ru anti-parallel coupling layer becomes equal to or thinner than 0.45 nm. This signifies the fact that at a Ru anti-parallel coupling layer thickness of 0.45 nm or below, the anti-ferromagnetic coupling becomes strong to such an extent that the ferromagnetic pinned layer does not saturate at an external magnetic field of 1600 kA/m (20 kOe). Consequently, the anti-ferromagnetic coupling of the ferromagnetic pinned layer is strongest and the remanence magnetization component is also almost zero when the thickness of the Ru anti-ferromagnetic layer is 0.35, or thereabout but within 0.3-0.4 nm. Thus, it can be seen that when using Ru for the anti-parallel coupling layer, its thickness should preferably be 0.3-0.4 nm.

Figure 11:
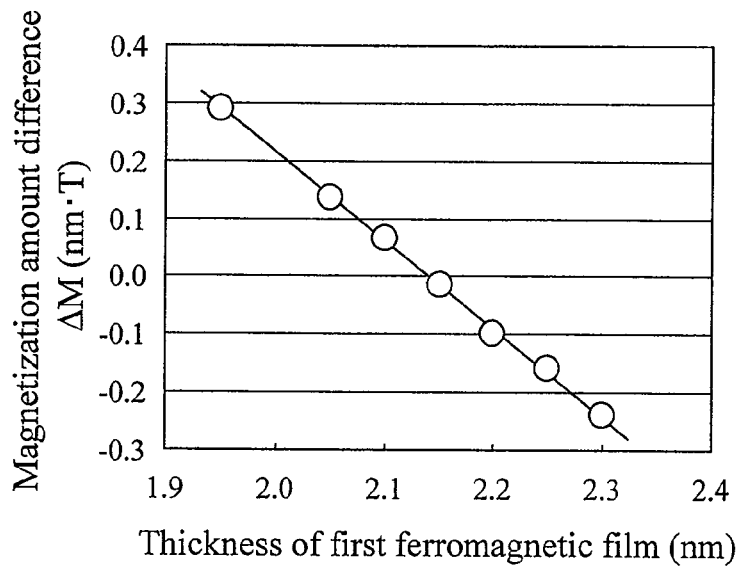
FIG. 11 is a diagram showing magnetization amount difference ΔM between a second ferromagnetic film and a first ferromagnetic film in relation to the thickness of the first ferromagnetic film.

Magnetization amount difference ΔM between the second ferromagnetic film and the first ferromagnetic film is shown in relation to the thickness of the first ferromagnetic film in FIG. 11. Here, assuming that the thickness of the second ferromagnetic film is constant, the magnetization amount is indicated as saturation magnetization (in teslas)×thickness (in nanometers). The configuration of the film is: substrate/underlayer/first ferromagnetic film Co-60 at. % Fe film/Ru film/Co-10 at. % Fe film (2 nm)/Cu film/Co-10 at. % Fe film/Ni-20 at. % Fe film/protection film. It can be seen that magnetization amount difference ΔM decreases simply in relation to the thickness of the first ferromagnetic film, and that magnetization amount difference ΔM can be set to zero or a value in the vicinity thereof by selecting an appropriate thickness for the first ferromagnetic film relative to the constant thickness of the second ferromagnetic film. In the present invention, this magnetization amount difference ΔM is a factor that greatly affects the functions as an angle sensor.

Figure 12:
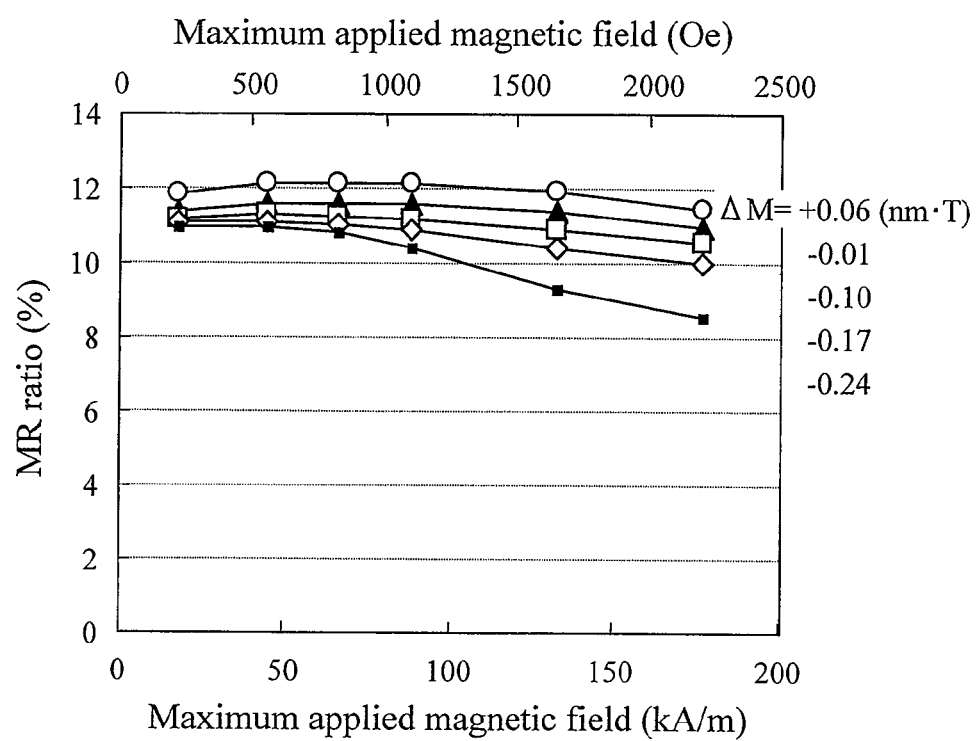
FIG. 12 is a diagram showing the relationship between the magnetoresistance ratio of a magnetoresistive film for sensor units and maximum applied magnetic field when magnetization amount difference ΔM is varied.

The relationship between the magnetoresistance ratio of a magnetoresistive film for use in a sensor unit and the maximum applied magnetic field when magnetization amount difference ΔM is varied is shown in FIG. 12. Measurements were taken by measuring the magnetoresistive curve by applying positive and negative magnetic fields in a film in-plane direction that is parallel to the magnetization direction of the ferromagnetic pinned layer of the magnetoresistive film, where the maximum applied magnetic field was initially 50 A/m and gradually increased. In other words, this is an experiment for measuring, with respect to a sensor unit comprising a self-pinned type magnetoresistive film, the upper limit up to which a ferromagnetic pinned layer is stable in relation to an external magnetic field.

When magnetization amount difference ΔM is −0.1 to 0.06 (nm·T), high MR ratios are maintained even when the maximum applied magnetic field exceeds 160 kA/m (2000 Oe). However, when magnetization amount difference ΔM reaches −0.17, the MR ratio at a maximum applied magnetic field of 160 kA/m (2000 Oe) is 10%, and it can be seen that there has occurred a drop in MR ratio by approximately 1%. Further, when magnetization amount difference ΔM is −0.24, a further drop is observed where the MR ratio at a maximum applied magnetic field of 160 kA/m (2000 Oe) is 8.5%. This drop in MR ratio after the maximum applied magnetic field is applied does not restore itself to the original value even when measured again with a lower magnetic field. This signifies the fact that unless magnetization amount difference ΔM is appropriately kept in the vicinity of zero, the magnetization direction of the ferromagnetic pinned layer changes due to external magnetic fields, and a predetermined performance cannot be maintained.

Figure 13:
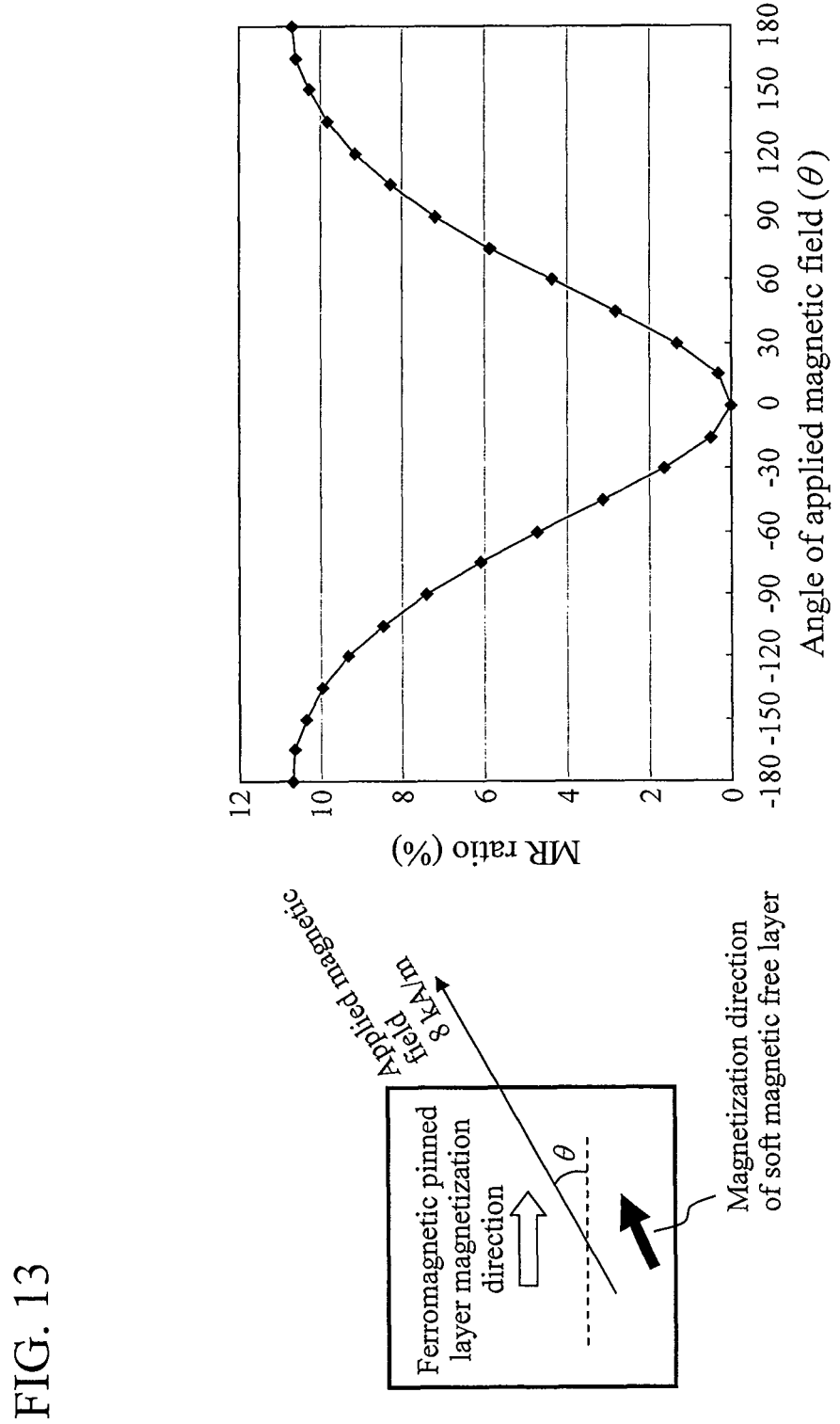
FIG. 13 is a diagram showing the magnetic field angle dependence of the electrical resistance of a magnetoresistive film for sensor units.

The magnetic field angle dependence of the electrical resistance of a magnetoresistive film for use in a sensor unit is shown in FIG. 13. As shown in the schematic diagram on the left in FIG. 13, measurements were taken by applying a magnetic field of 8 kA/m (100 Oe) at an in-plane angle of θ relative to the magnetization direction of the ferromagnetic pinned layer of the magnetoresistive film, and measuring the resistance while varying angle θ. This magnetic field angle dependence of resistance clearly shows that a magnetoresistive film of the present invention for use in a sensor unit is effective as an angle sensor. Specifically, when angle θ is varied, the angle formed between the magnetizations of the soft magnetic free layer, whose magnetization rotates in the direction of the magnetic field, and the ferromagnetic pinned layer, whose magnetization does not change from the magnetization direction, changes, and the magnetoresistive effect is generated in accordance therewith. At the same time, by taking such measurements, it is possible to measure the magnetization directions of and the ferromagnetic pinned layers of the magnetoresistive films that form the sensor unit.

Figure 14:
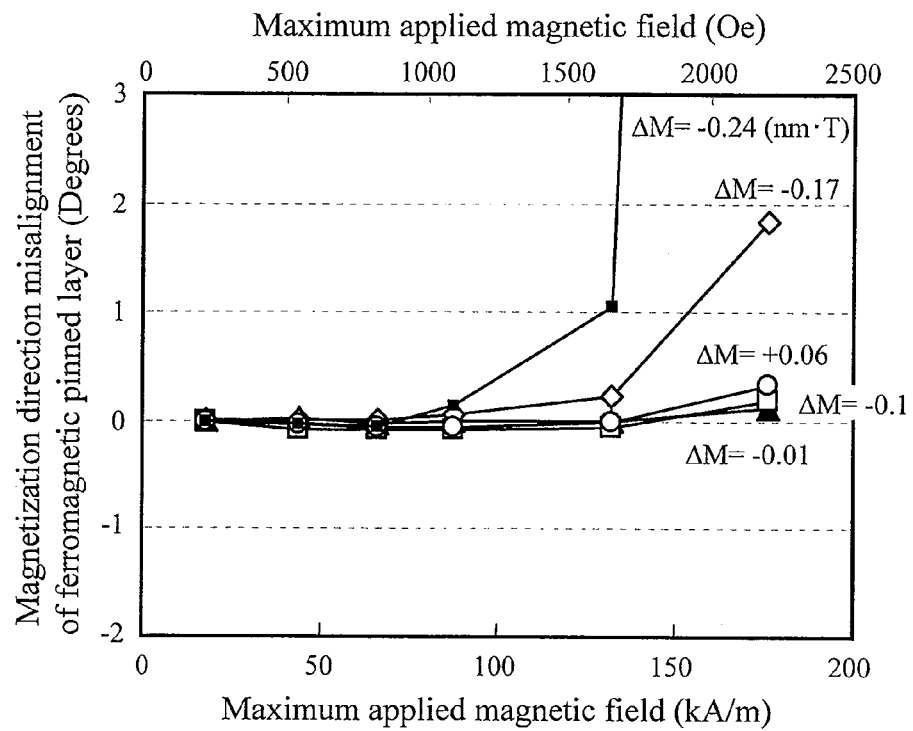
FIG. 14 is a diagram showing the relationship between the angle misalignment of a ferromagnetic pinned layer of a magnetoresistive film for sensor units and maximum applied magnetic field when magnetization amount difference ΔM is varied.

The relationship between the magnetization direction misalignment of the ferromagnetic pinned layer of a magnetoresistive film for use in a sensor unit and maximum applied magnetic field when magnetization amount difference ΔM is varied is shown in FIG. 14. When magnetization amount difference ΔM is in the vicinity of zero, the magnetization direction misalignment is extremely small. As magnetization amount difference ΔM moves away from zero, a quadratic increase in magnetization direction misalignment is observed where the magnetization direction misalignment exceeds 1°.

The angle misalignment shown in FIG. 14 has great significance with respect to angle sensors and angle detection devices, which are objects of the present invention. In the case of applications to magnetic heads as in Patent Document 5, the drop in MR ratio shown in FIG. 12 simply results in a drop in signal output, and while some drop in MR ratio may be a disadvantage, it is not fatal. Further, for magnetic heads, an angle misalignment of a few degrees or less as in FIG. 14 has effectively no influence on the performance of magnetic heads. In contrast, with an angle sensor of the present invention, the angle to be detected is directly affected by this angle misalignment, and the angle misalignment is translated directly into angle error.

Figure 15:
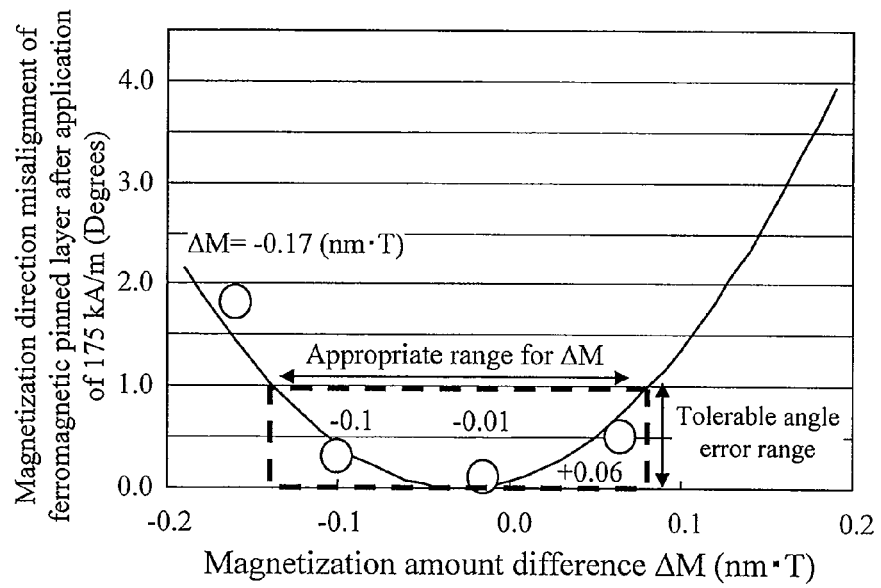
FIG. 15 is a diagram showing the relationship between magnetization amount difference ΔM and the magnetization direction misalignment of a ferromagnetic pinned layer after 175 kA/m (2.2 kOe) has been applied.

The relationship between magnetization amount difference ΔM and the magnetization direction misalignment of the ferromagnetic pinned layer after applying 175 kA/m (2.2 kOe) is shown summarized in FIG. 15. As magnetization amount difference ΔM moves away from zero, there is observed a quadratic increase in angle misalignment, and based on a quadratic approximation curve calculated by the method of least squares, when ΔM is negative and the absolute value thereof is greater than 0.15 nm·T, angle misalignment exceeds 1°. Assuming that keeping angle error at or below 1° is some measure of performance as an angle sensor, it can be seen from FIG. 15 that the needs as an angle sensor are met by keeping magnetization amount difference ΔM within −0.15 to 0.08. Thus, it is possible to attain high output and high stability by having a sensor unit of an angle sensor of the present invention comprise a self-pinned type ferromagnetic pinned layer comprising FeCo and CoFe magnetic layers that are strongly coupled anti-ferromagnetically, and setting magnetization amount difference ΔM near zero within −0.15 to 0.08.

Figure 16:
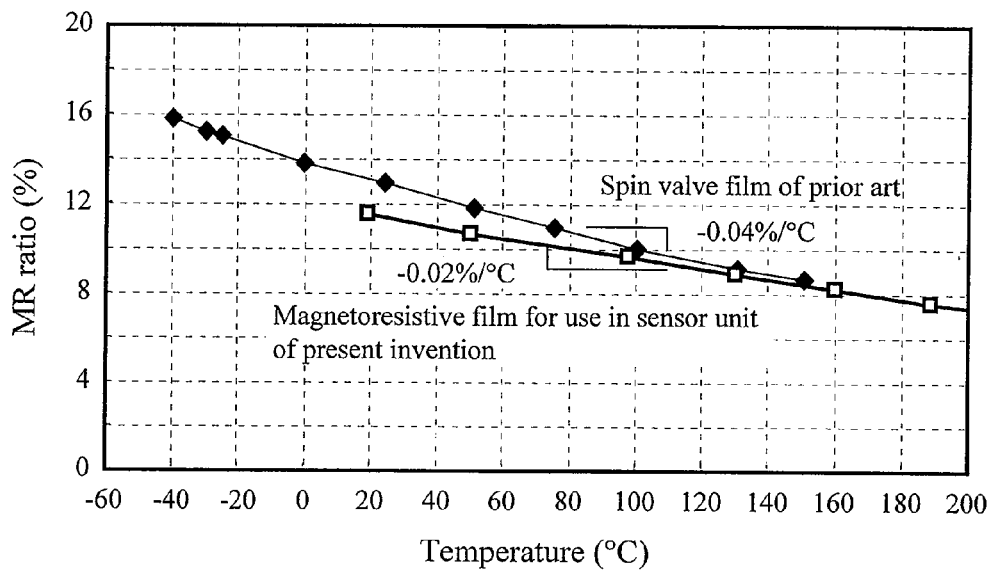
FIG. 16 is a diagram showing the temperature dependence of the MR ratio of a magnetoresistive film of the present invention for sensor units.

The temperature dependence of the MR ratio of a magnetoresistive film for use in a sensor unit of the present invention is shown in FIG. 16. For comparison, the same is shown for a spin valve film that uses a well-known anti-ferromagnetic film. With an ordinary spin valve film, the MR ratio decreases continuously from −40° C. to 150° C. Although operating temperature ranges for angle sensors are not determined absolutely, here, −40° C. to 150° C. were taken to be common operating temperatures for angle sensors. It is speculated that such a continuous decrease as that mentioned above is simply caused by an increase in the electrical resistance of a metal that accompanies a rise in temperature, and that the magnetoresistive effect is reduced as a result. It was confirmed that similar tendencies were also exhibited up to 190° C. by a magnetoresistive film for use in an angle sensor of the present invention. However, when attention is directed to the proportion by which MR ratio decreases due to a rise in temperature, the temperature coefficient is −0.02%/° C. for a magnetoresistive film for use in a sensor unit of the present invention, and −0.04%/° C. for a conventional spin valve film. It can thus be seen that a magnetoresistive film for use in a sensor unit of the present invention has an advantage in that the change with respect to temperature is small. Specifically, within the operating temperature range of −40° C. to 150° C., a sensor unit of the present invention exhibits such properties where temperature dependence is reduced by approximately ⅓ to ½ as compared to a sensor of a conventional structure.

Figure 17:
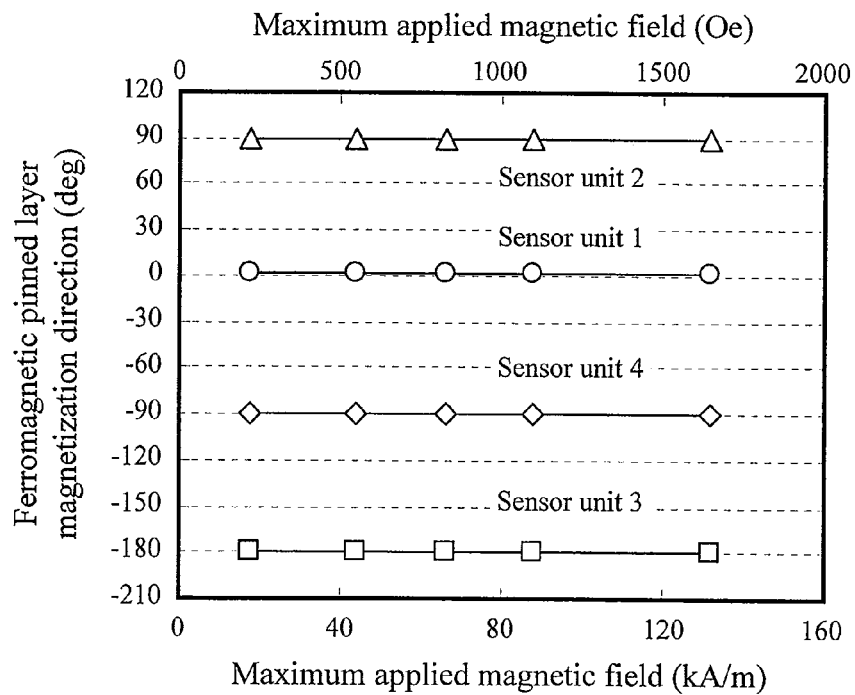
FIG. 17 is a diagram showing the relationship between the maximum applied magnetic field of four sensor units for which thin films were formed by varying the direction of magnetic field application by 90° each and the magnetization direction of the ferromagnetic pinned layer.

The relationship between the maximum applied magnetic field and the magnetization direction of the ferromagnetic pinned layer with respect to four sensor units that were thin-film formed on an angle sensor of the present invention by changing the magnetic field application direction by 90° each is shown in FIG. 17. The vertical axis in the diagram is set over a large angle range in order to observe the general behavior of each sensor. Here, magnetization amount differences ΔM between the ferromagnetic films of the ferromagnetic pinned layer of each of the four sensor units were formed at almost zero. By forming the ferromagnetic pinned layer of the magnetoresistive film for use in a sensor unit within a magnetic field in a predetermined direction, the magnetization directions of the ferromagnetic pinned layers of sensor units 1-4 are respectively magnetized in directions of 0°, 90°, −180° and −90°, and it can be seen that the directionality thereof is unchanged even when a magnetic field of 135 kA/m (1700 Oe) is applied. Thus, since sensor units of the present invention can have their magnetization directions determined by the magnetic field application direction during the formation of the magnetoresistive films, and are stable with respect to external magnetic fields, they function as sensor units with magnetic field directions of mutually differing angles in accordance with these magnetization directions.

As described above, by applying a magnetic field in an appropriate direction during the formation of the magnetoresistive films of a sensor unit, it is possible to obtain a sensor unit whose ferromagnetic pinned layer is magnetized. The magnetic anisotropy of the soft magnetic free layer will be described below. The magnetization direction of the ferromagnetic pinned layer can be determined by forming it while applying a magnetic field. On the other hand, when the soft magnetic free layer is formed, there occurs uniaxial anisotropy where the magnetization direction thereof becomes the magnetis easy axis. A manufacturing method that is most easily understood is a case where a magnetic field is applied during the formation of a soft magnetic free layer in the same direction as the magnetic field application direction for the ferromagnetic pinned layer, and anisotropy is induced.

Figure 18:
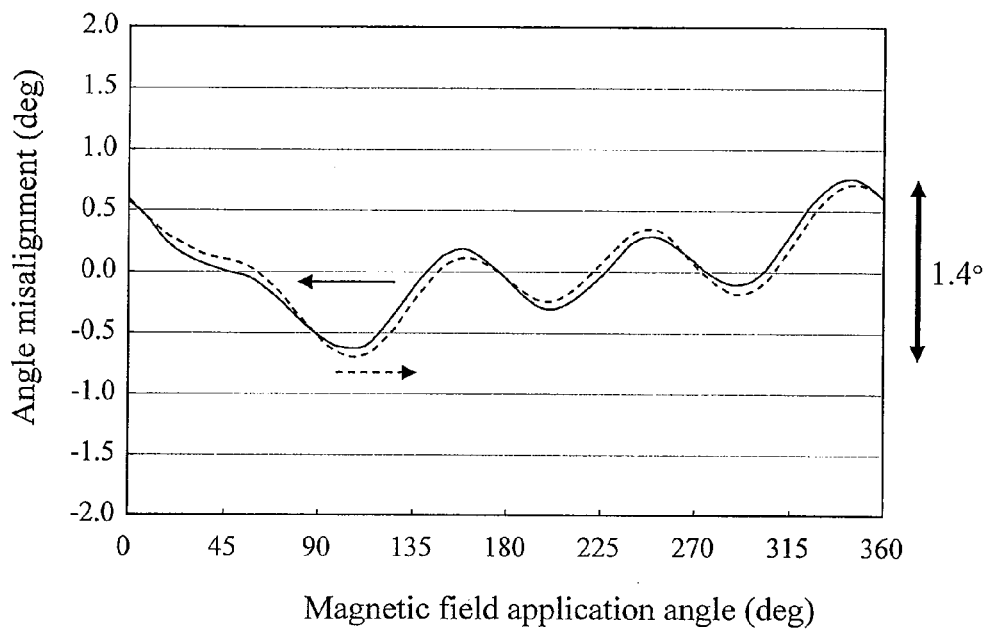
FIG. 18 is a diagram showing the angle misalignment of an angle sensor having four sensor units whose easy magnetization direction of the soft magnetic free layer is the same direction as the ferromagnetic pinned layer.

There is shown in FIG. 18 the angle misalignment of an angle sensor having four sensor units, wherein the magnetic easy axis of the soft magnetic free layer is in the same direction as the ferromagnetic pinned layer. Here, the term angle misalignment refers to the misalignment between the application direction of the magnetic field to be measured and the angle calculated from the output of the angle sensor. In the figure, the measurements of the broken line represent measurements from 0° to 360°, and the solid line conversely represents measurements from 360° to 0°. There are no huge discrepancies between the two, and it can be seen that the hysteresis of this angle sensor is not large. On the other hand, it can be seen that angle misalignment varies depending on the application angle of the magnetic field, and that there occurs an angle misalignment as large as 1.4° in width from peak to peak when measured across 360°. The cause of occurrence of this angle misalignment is more easily understood when the results above are measured by separating the four sensor units into an X component and a Y component. Specifically, half-bridges comprising, of the sensor units, the pair whose magnetization directions of the ferromagnetic pinned layers are 0° and 180° and the pair whose magnetization directions of the ferromagnetic pinned layers are 90° and −90° correspond to the X component and the Y component.

Figure 19:
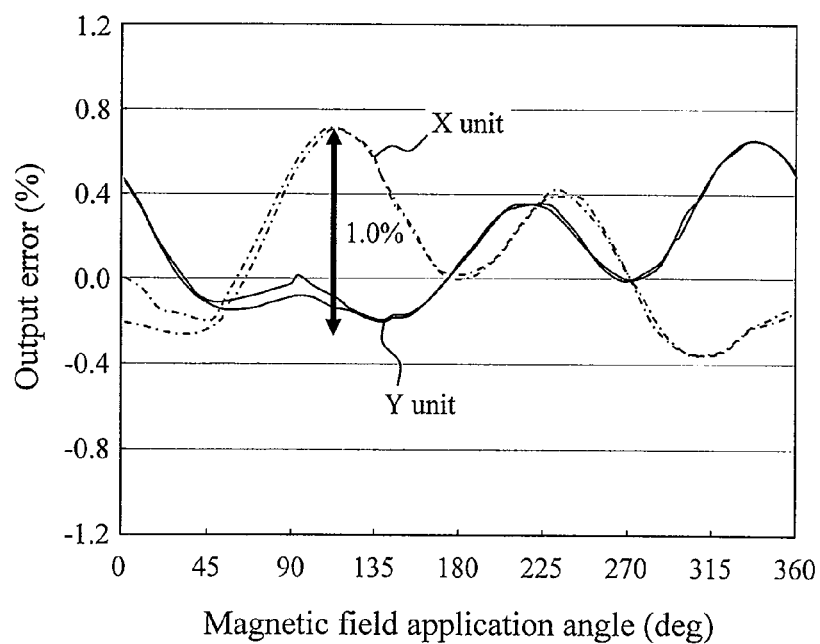
FIG. 19 is a diagram showing output errors in the X components and Y components of an angle sensor.

FIG. 19 shows the output errors of the X-side unit and the Y-side unit of the sensor in FIG. 18. The two lines for each represent measurement results in the increasing direction and decreasing direction of angle as in FIG. 18. However, since their differences are negligible, they will hereinafter be disregarded. Here, the output errors are such that the value difference with respect to the cosine of the application direction of the magnetic field to be measured having an amplitude corresponding to the maximum value and minimum value of the output of the X- or Y-component bridge is shown relative to the amplitude. While the output error exhibits complex behavior with respect to the magnetic field application angle for both the X component and the Y component, it can be seen that there are two crests and troughs each between 0° and 360°, and the components are particularly large twice. The output error in this instance was approximately 1.0% from peak to peak when measured across 360°.

In order to clarify the cause of such output errors, a static magnetic field magnetization behavior analysis of an angle sensor was conducted. In addition to the magnetization angle, electrical resistance, and magnetoresistance ratio of the four sensor units, the interlayer coupling magnetic field and the uniaxial anisotropy constant of each were also included in the analysis. Here, the term interlayer coupling magnetic field refers to the magnetic coupling field between the ferromagnetic pinned layer and the soft magnetic free layer, and actual measurement values of the produced magnetoresistive film for use in a sensor unit were used. Because it is difficult to measure the uniaxial anisotropy constant with thin films, it was derived by fitting it with measurement results since it is ordinarily on the order of several hundreds of A/m (several Oe). Further, an angle setting misalignment of the ferromagnetic pinned layers was assumed between the X-side sensor unit and the Y-side sensor unit, and this was also taken to be a fitting parameter.

Figure 20:
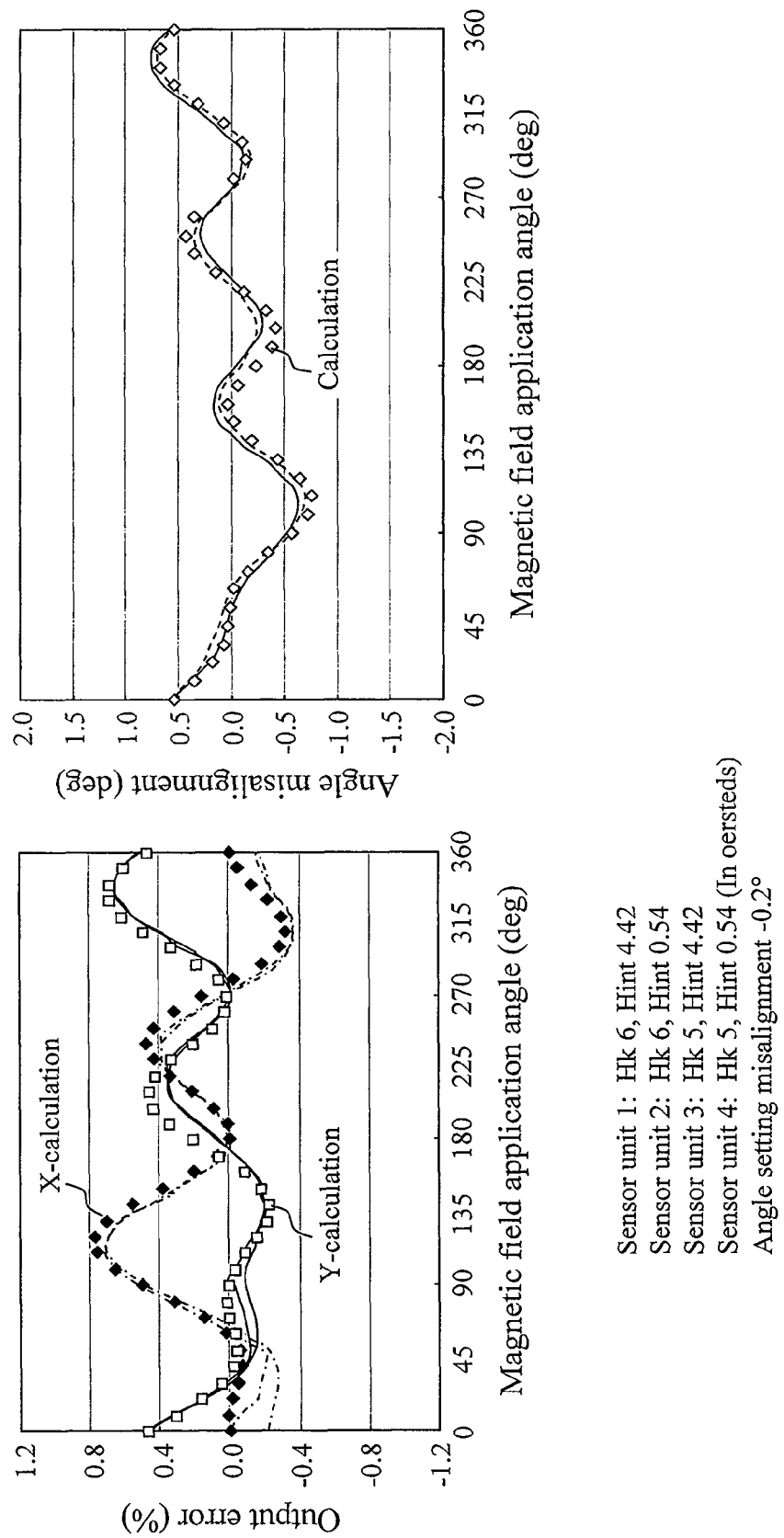
FIG. 20 is a diagram showing the magnetic field applied angle dependence of output error and angle misalignment by an analytical model.

The magnetic field application angle dependence of output error and angle misalignment by an analytical model is shown in FIG. 20. In the figure, the solid lines and the dotted-and-dashed lines represent the actual measurement values shown in FIG. 18 and FIG. 17, and the other and ♦ marks represent calculation results by analysis. The values used for uniaxial anisotropic magnetic field $H_k$ (Oe), interlayer coupling magnetic field $H_{int}$ (Oe), and angle setting misalignment are shown below.

Sensor unit 1: $H_k$ 6, $H_{int}$ 4.42
Sensor unit 2: $H_k$ 6, $H_{int}$ 0.54
Sensor unit 3: $H_k$ 5, $H_{int}$ 4.42
Sensor unit 4: $H_k$ 5, $H_{int}$ 0.54 (in units of Oe)
Angle setting misalignment −0.2°

As can be seen from FIG. 20, the output error and the angle error based on the analytical model coincide well with the actual measurement values, and whatever the cause(s) of the error/misalignment of the angle sensor may be, it can be seen that it/they is/are taken into account within the present analytical model. Hereinafter, the analysis results shown in FIG. 20 will be referred to as initial analysis values.

Figure 21:
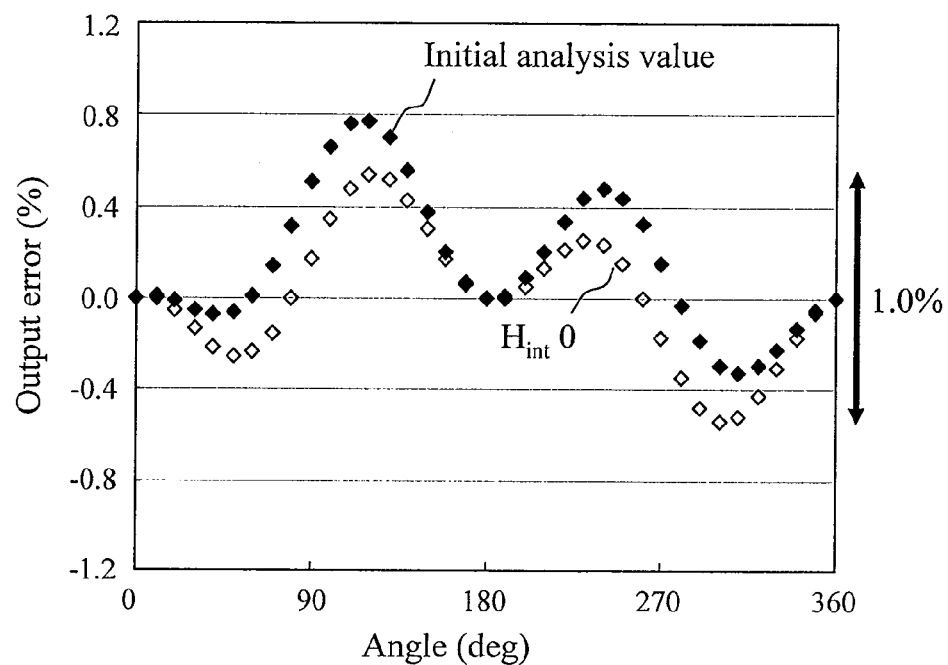
FIG. 21 is a diagram showing the output error of an X-component bridge where inter-layer coupling magnetic field $H_{int}$ is made to be zero for all sensor units.

The output error of the X-component bridge in a case where interlayer coupling magnetic field $H_{int}$ is made to be zero with respect to all sensor units is shown in FIG. 21. While output error changed slightly, it can be seen that the output error from peak to peak remained unchanged at 1.0% and that it is substantially unchanged from the initial analysis values or the actual measurement values. The angle error in this instance was 1.0°.

Figure 22:
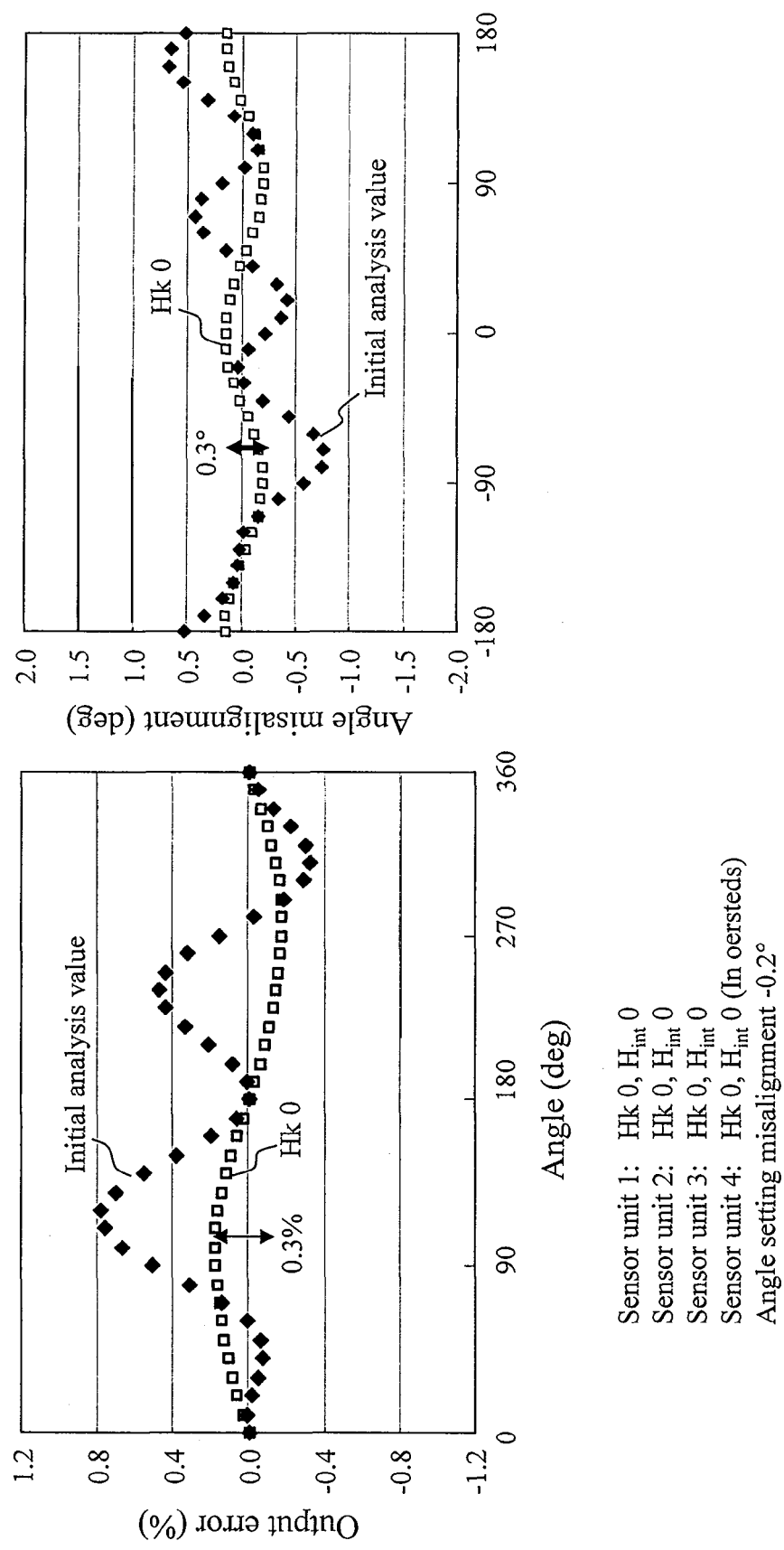
FIG. 22 is a diagram showing the output error of an X-component bridge and the angle error of an angle sensor where $H_{int}$ and $H_k$ are made to be zero.

On the other hand, FIG. 22 shows the output error of an X-component bridge and the angle error of an angle sensor in a case where $H_{int}$ and $H_k$ were made to be zero. As a result of making $H_k$ be zero, the output error of the X-component bridge became evidently smaller to become approximately ¼ of the initial analysis value at 0.3% in peak-to-peak width, that is, approximately ¼ of the actual measurement value. The angle error was also similarly reduced to approximately ¼ at 0.3°. This remanent error of 0.3° is speculated to be caused by angle misalignments of the X and Y sensors, and the like.

It can thus be seen that reducing the uniaxial anisotropy of the soft magnetic free layer is effective in reducing the angle error of an angle sensor. The angle error in the case in FIG. 21 where $H_{int}$ is zero is 1.0°, and the angle error in the case in FIG. 22 where $H_k$ is made to be zero is 0.3°. It can be seen that the effect of making $H_k$ be zero in the present invention experimentally amounts to a reduction in angle error by 0.7° in terms of peak width. Specifically, when the $H_k$ reduction effect of the present invention is not used, a reduction of up to 1.0−0.3=0.7° in peak width is the limit for the angle error of a sensor, and through application of the present invention, an angle error of less than 0.7° can be realized.

A method of reducing $H_k$ is discussed in further detail. The uniaxial anisotropy of the soft magnetic free layer can be controlled after thin film formation and after element formation by performing a heat treatment on a magnetoresistive film for use in sensor units. This is because when a heat treatment of 200° C. or above is performed, the uniaxial anisotropy of extremely thin soft magnetic free layers, including generally available spin valve films, shifts in a heat activated manner to uniaxial anisotropy having a magnetic easy axis in the direction of the magnetic field or in the magnetization direction of the soft magnetic free layer. In other words, by performing a heat treatment on an angle sensor within a rotating magnetic field, thereby making the uniaxial anisotropy of the soft magnetic free layer, in a sense, isotropic, it is possible to obtain an angle sensor whose angle error is reduced as shown in FIG. 22.

Here, what becomes problematic with conventional angle sensors is that when a heat treatment is performed where the uniaxial anisotropy of the soft magnetic free layer is made isotropic as mentioned above, the exchange coupling anisotropy of the anti-ferromagnetic film is reduced, made isotropic, or an increase in dispersion is caused, and functions as an angle sensor are lost. On the other hand, an angle sensor of the present invention, as has been described up to this point, comprises sensor units that operate stably even with respect to external magnetic fields up to high temperatures, and does not apply the exchange coupling magnetic field of the anti-ferromagnetic film. The above-mentioned heat treatment for making the uniaxial anisotropy of the soft magnetic free layer isotropic becomes an extremely effective method only in connection with a highly stable sensor unit of the present invention.

The heat treatment for causing isotropy is capable of achieving homogenization of the directionality of uniaxial anisotropy by applying a magnetic field of a level that is sufficient for magnetizing the magnetization of the soft magnetic free layer in a predetermined direction, and performing a heat treatment and cooling while rotating in an in-plane direction of the substrate. The magnetization direction of the soft magnetic free layer can be temporally equalized by rotating application of a magnetic field of an appropriate size, namely, a magnetic field of approximately 4 to 40 kA/m (50 to 500 Oe), during a rotary heat treatment and during cooling so that there would be no such influences during the heat treatment as the magnetic field from nearby equipment of a ferromagnetic material, geomagnetism, and the like. This appropriate size of the magnetic field is greater than the shape anisotropic magnetic field caused by the induced magnetic anisotropy of the magnetic film and by patterning in the form of a strip, and must be selected so as not to generate such misalignment of the ferromagnetic pinned layer as those shown in FIG. 14 even at high temperatures. This is because, outside of this appropriate range, there is a risk that the magnetic field may be too low that effects of the induced magnetic anisotropy vanishing heat treatment cannot be attained sufficiently, or that misalignment in the magnetization direction of the ferromagnetic pinned layer may occur to cause a decrease in output or an increase in angle error. Through this vanishing treatment in an appropriate magnetic field, the directionality of uniaxial anisotropy can be equalized, and the angle error of an angle sensor of the present invention can be reduced.

By producing an angle sensor with reduced $H_k$ by the method mentioned above and taking measurements, it was confirmed that an angle sensor of the present invention is capable of realizing an angle error of 0.8° or less in peak width. With respect to the method of heat treatment, similar effects as those of a heat treatment in a rotating magnetic field can be attained by switching the magnetic field direction, for example, a switching heat treatment between 0° and 90°, instead of a rotating magnetic field. If the magnetization direction of the soft magnetic free layer during the heat treatment does not orient itself in a particular direction due to such factors as geomagnetism, etc., it is also possible to reduce the directionality of the uniaxial anisotropy of the soft magnetic free layer through a heat treatment in zero magnetic field. Here, for the heat treatment in zero magnetic field, since it is a requisite that the external magnetic field be in a range that effectively does not saturate the magnetization state of the magnetic film, it should be equal to or less than 0.8 kA/m (10 oersteds), which is smaller than the size of the coercive force of a magnetic film that is generally identified as soft magnetic.

Figure 23:
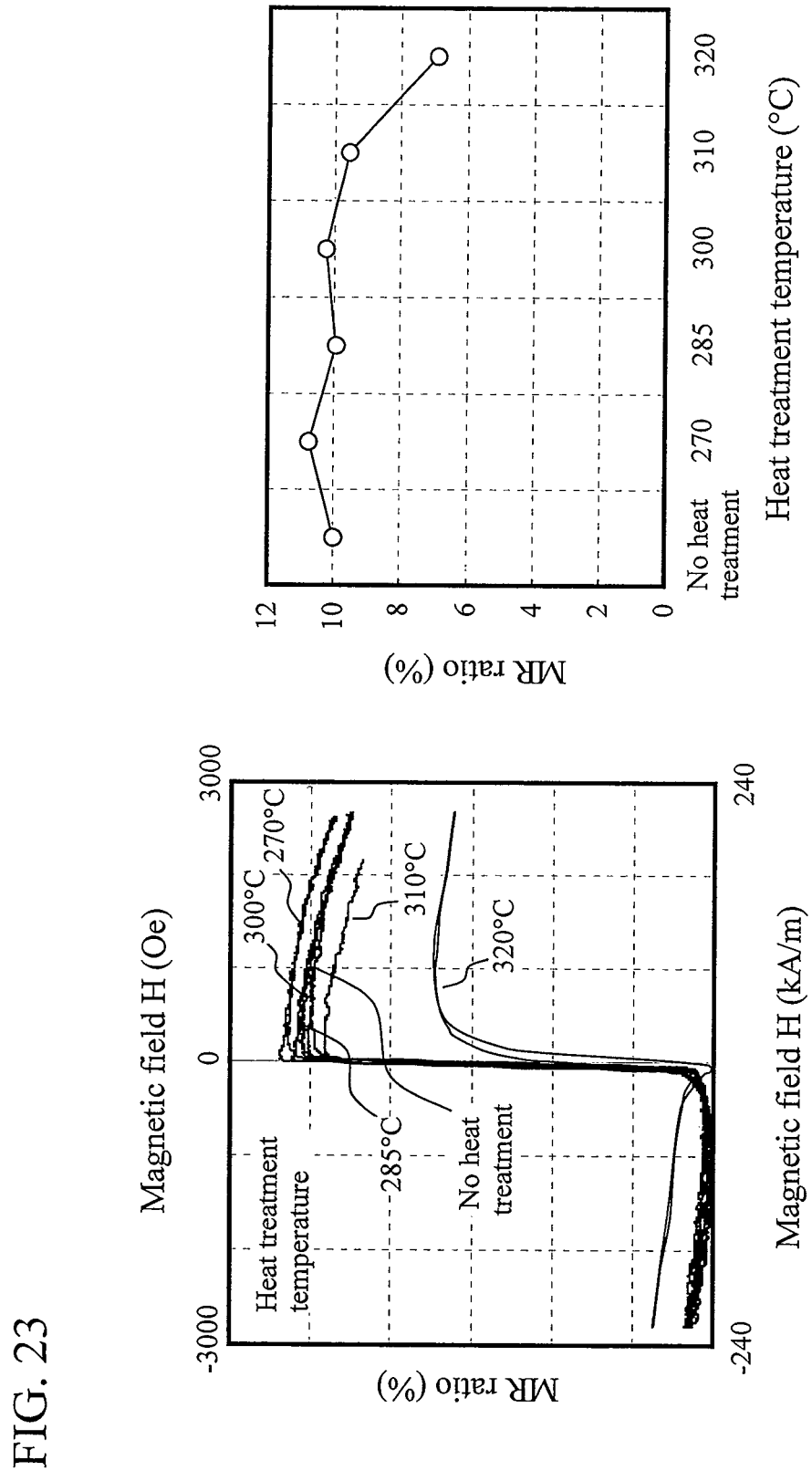
FIG. 23 is a diagram showing magnetoresistive curves of sensor units of the present invention after heat treatment.

The appropriate temperature range for a heat treatment for creating isotropy is, in one aspect, temperatures at which the induced magnetic anisotropy (uniaxial anisotropy) of the soft magnetic free layer becomes thermally alterable, and are greater than approximately 200° C. On the other hand, the upper limit on the high temperature side is determined by the heat resistance of an angle sensor of the present invention. Magnetoresistive curves of sensor units of the present invention after heat treatment are shown in FIG. 23. The heat treatment was performed within zero magnetic field, and the heat treatment duration was three hours. Magnetoresistive curves are shown in the diagram on the left in FIG. 23, where there is no drop in MR ratio up to a heat treatment temperature of 310° C., and MR ratio drops at 320° C. Along with the drop in MR ratio, the magnetoresistive curves depart from a step function-like and so-called spin valve-like magnetoresistive curve, which is speculated to be the result of becoming unable to maintain magnetic isolation between the ferromagnetic pinned layer and the soft magnetic free layer. The relationship between heat treatment temperature and MR ratio is shown in the diagram on the right in FIG. 23, where it can be seen that the heat treatment temperature for a magnetoresistive film for use in a sensor unit of the present invention should preferably be 300° C. or below. This is because at 200° C. or below, induced anisotropy does not change easily, and at temperatures exceeding 300° C., characteristics of the magnetoresistive film forming an angle sensor drop.

Figure 24:
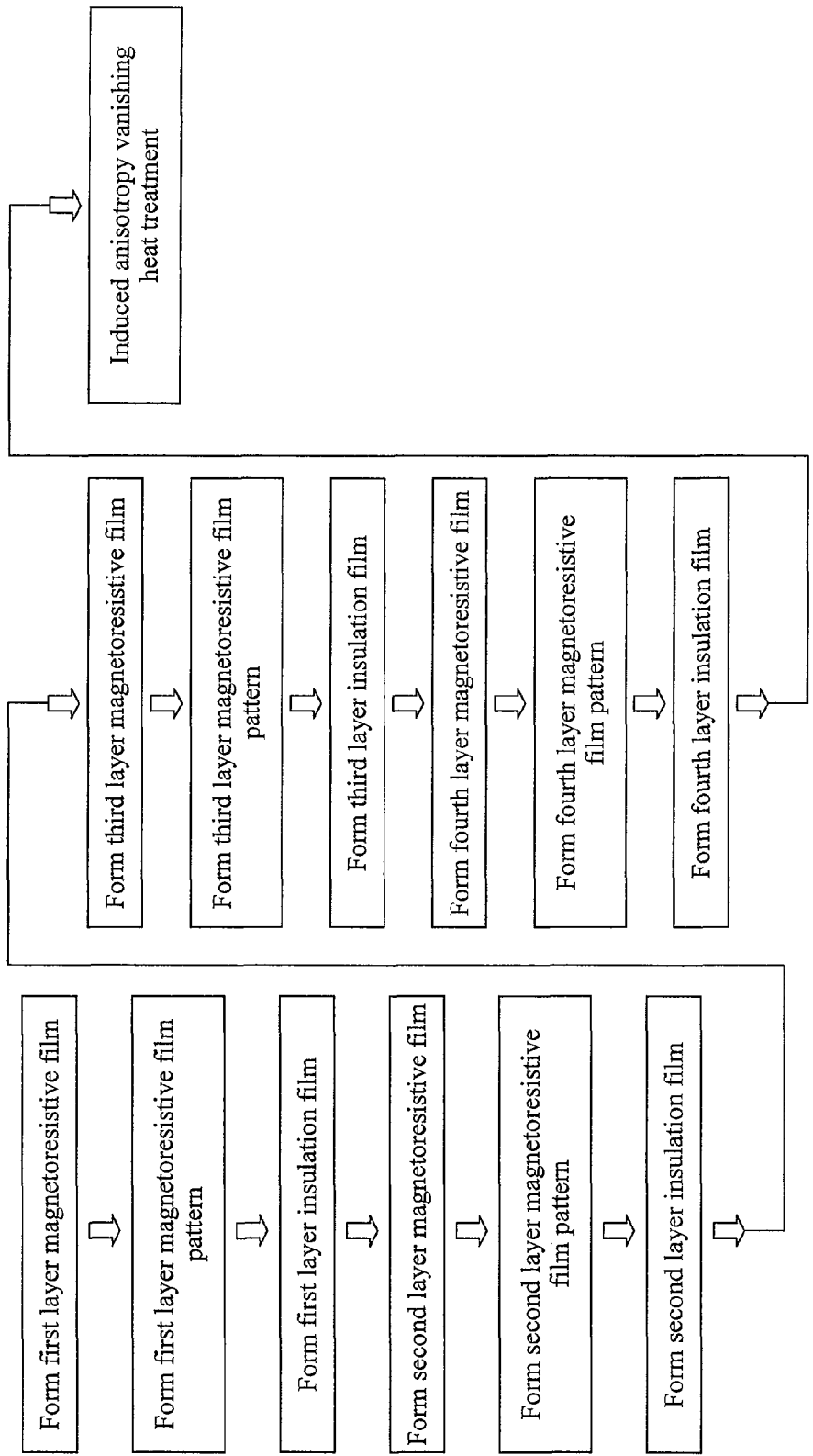
FIG. 24 is a diagram showing the flow of a manufacturing method of an angle sensor of the present invention.

A flow example of a manufacturing method for an angle sensor of the present invention is shown in FIG. 24. In a case where eight sensor units are formed of four pairs with differing magnetization directions, in order to form sensor units of a first layer on a substrate, there is performed a step of forming a magnetoresistive film in a predetermined magnetic field direction, patterning it, and covering it with an insulation film. Next, a similar step is performed for a second layer, except that the direction of the magnetic field during the formation of the magnetoresistive film is altered. Similar steps are performed for a third layer and a fourth layer as well. Manufacturing steps for electrode terminals have been omitted. They may be formed per layer, or they may be formed by performing, after the last layer has been formed, a step of piercing electrode terminal portions through to the first layer, and a step of forming an electrode material. Finally, an induced anisotropy vanishing heat treatment for the soft magnetic free layer is performed.

Figure 25:
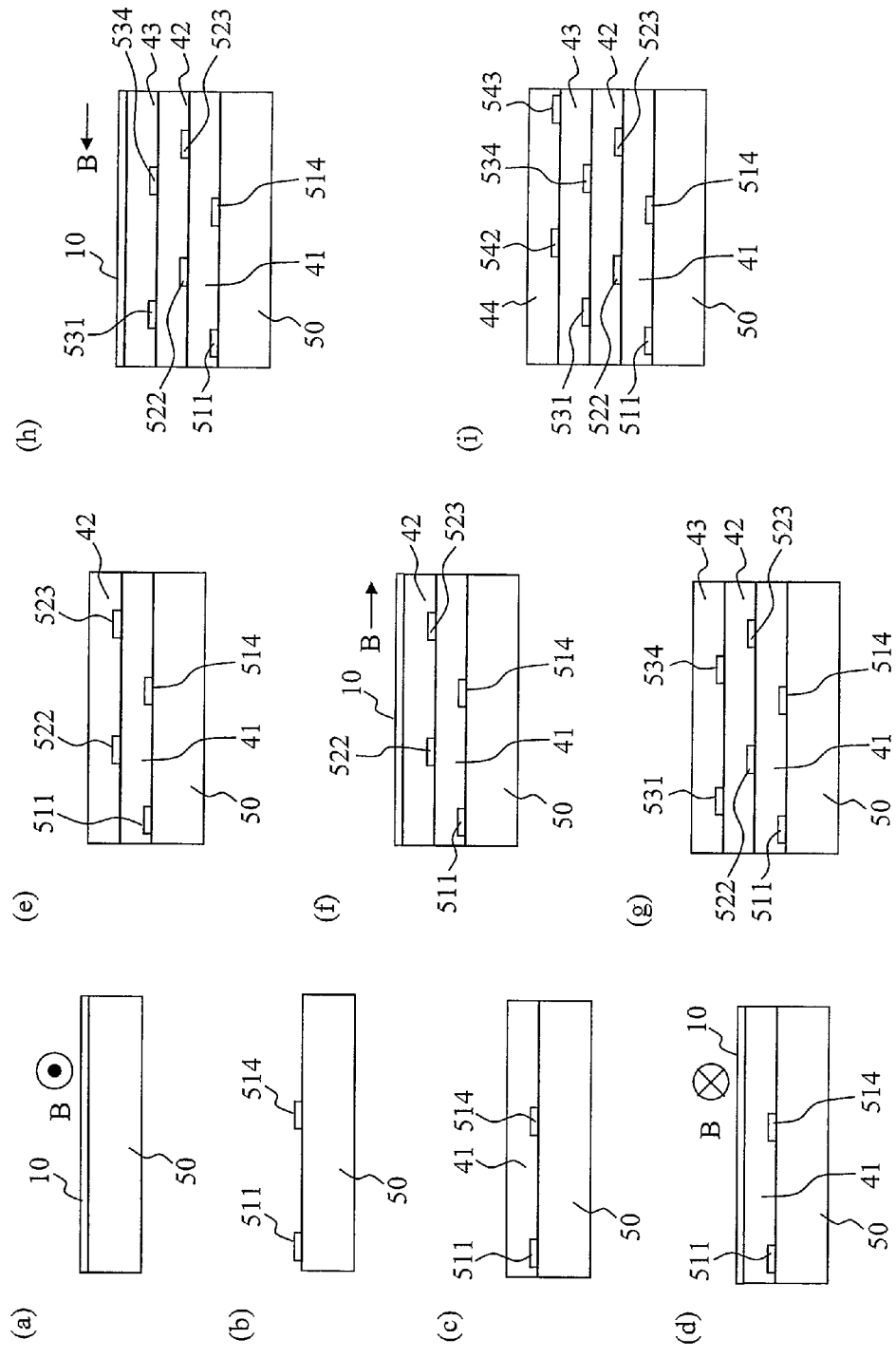
FIG. 25(a)-(i) is a process chart showing a manufacturing method of an angle sensor of the present invention.

An example of a manufacturing method for an angle sensor of the present invention is shown in FIG. 25 by means of a sectional process chart. Here, in order to show the layer configuration in a simplified manner, drawings pursuant to the diagram on the left in FIG. 3 are used. Production is performed with the steps in the flow shown in FIG. 24 as a layered configuration as shown in FIG. 25. At the first layer, as shown in FIG. 25(a), a magnetoresistive film 10 is formed on a substrate 50 while applying a magnetic field directed, for example, out of the page, and the magnetoresistive film is patterned as shown in FIG. 25(b) to form a first sensor unit 511 and a fourth sensor unit 514. Then, an insulation film 41 is formed as shown in FIG. 25(c). Next, the second layer is formed. First, as shown in FIG. 25(d), a magnetoresistive film 10 is formed while applying a magnetic field directed into the page, and the magnetoresistive film is patterned as shown in FIG. 25(e) to form a second sensor unit 522 and a third sensor unit 523. An insulation film 42 is then formed.

Next, as shown in FIG. 25(f), a magnetoresistive film 10 for a third layer is formed while applying a magnetic field directed, for example, from left to right on the page. Next, the magnetoresistive film is patterned as shown in FIG. 25(g) to form a fifth sensor unit 531 and an eighth sensor unit 534. An insulation film 43 is then formed. Next, as shown in FIG. 25(h), a magnetoresistive film 10 for a fourth layer is formed while applying a magnetic field directed from right to left on the page. Next, the magnetoresistive film is patterned as shown in FIG. 25(i) to form a sixth sensor unit 542 and a seventh sensor unit 543. An insulation film 44 is then formed.

Thus, in the steps for forming the magnetoresistive films for the first, second, third and fourth layers, the magnetic field application direction is changed as indicated with the arrows in FIG. 25. Through such a production method, plural sensor units are formed so as to differ in their magnetization directions from layer to layer. An induced anisotropy vanishing heat treatment is then performed to reduce the induced magnetic anisotropy of the soft magnetic free layer, and a bridge circuit is assembled, as a result of which it is possible to obtain an angle sensor with little angle error.

Figure 26:
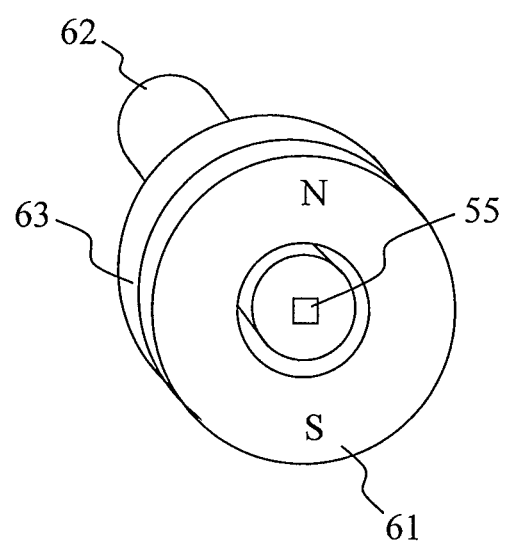
FIG. 26 is a diagram showing a configuration example of an angle detection device using an angle sensor of the present invention.

A configuration example of an angle detection device using an angle sensor of the present invention is shown in FIG. 26. A rotary driving body 63 performs a rotary motion relative to a rotary drive shaft 62, and causes a magnet 61 to perform a rotary motion relative to an angle sensor 55. Here, there is described a rotary mechanism wherein the above-mentioned angle sensor is installed within the rotary shaft, and the magnet rotates around the rotary shaft. Through this rotary motion, a magnetic field is applied from the magnet 61 to the angle sensor 55 in a direction corresponding to the rotation angle, and it is possible to detect from the output of the angle sensor 55 the angular relationship between the rotary driving body 63 and the rotary drive shaft 62.

By configuring an angle sensor and angle detection device of the present invention with such structures, it is possible to obtain an angle sensor and angle detection device whose output is large and angle misalignment is small over a wide temperature range.

The invention claimed is:

1. An angle sensor having a layered structure in which a plurality of magnetoresistive sensor units are stacked in a film thickness direction with interposed insulation films, wherein
   each sensor unit comprises: a self-pinned type ferromagnetic pinned layer in which a first ferromagnetic film and a second ferromagnetic film are anti-ferromagnetically coupled with an interposed anti-parallel coupling film; a nonmagnetic intermediate layer; and a soft magnetic free layer, wherein the first ferromagnetic film and the second ferromagnetic film have substantially the same Curie temperature and the difference in magnetization amount therebetween is substantially zero,
   magnetizations of the ferromagnetic pinned layers of the sensor units belonging to different layers are respectively oriented in different directions,
   a bridge circuit that outputs a signal corresponding to an external magnetic field is built by the plurality of sensor units, and
   induced anisotropy of the soft magnetic free layers of the sensor units is made isotropic.

2. The angle sensor according to claim 1, further comprising:
a first bridge circuit into which are built a sensor unit whose direction of magnetization of the ferromagnetic pinned layer is in a first direction, and a sensor unit whose direction of magnetization of the ferromagnetic pinned layer is in the opposite direction thereof; and
a second bridge circuit into which are built a sensor unit whose direction of magnetization of the ferromagnetic pinned layer is in a second direction that is orthogonal to the first direction, and a sensor unit whose direction of the magnetization of the ferromagnetic pinned layer is in the opposite direction thereof.

3. The angle sensor according to claim 1, wherein the bridge circuit comprises four or more sensor units, and a magnetization direction of the ferromagnetic pinned layer is different for each sensor unit.

4. The angle sensor according to claim 1, comprising four sensor units, wherein the four sensor units have magnetization directions of the ferromagnetic pinned layer that respectively differ by 90° each, the four sensor units form two half-bridge circuits, and each of the half-bridge circuits includes a pair of sensor units whose magnetization directions differ mutually by 180°.

5. The angle sensor according to claim 1, wherein a plurality of sensors are provided in one layer, and the magnetizations of the ferromagnetic pinned layer of the plurality of sensor units belonging to the same layer are oriented in the same direction.

6. The angle sensor according to claim 5, comprising four layers, and a total of eight sensor units that are disposed two per layer, wherein the eight sensor units comprise four pairs whose magnetization directions of the ferromagnetic pinned layer respectively differ by 90° each, the four pairs of sensor units form two full-bridge circuits, and each full-bridge circuit includes two sensor units, whose magnetization directions are the same, and two other sensor units, whose magnetization directions differ by 180° from the two sensor units.

7. The angle sensor according to claim 1, wherein the first ferromagnetic film comprises a Fe-20 to 60 at. % Co alloy, and the second ferromagnetic film comprises a Co-0 to 40 at. % Fe alloy.

8. The angle sensor according to claim 1, wherein a predetermined, angle accuracy is maintained over a temperature range of from −50° C. to 150° C.

9. The angle sensor according to claim 1, wherein the insulation films are disposed to the sides of the sensor units in the width direction and above and below the sensor units in the thickness direction, and other sensor units formed in layers and a substrate are disposed, and there is not provided a heating electrode adjacent to the sensor units.

10. The angle sensor according to claim 2, wherein angle errors of outputs of the first and second bridge circuits are less than 0.7% p-p.

11. An angle sensor manufacturing method, comprising:
a step of forming a sensor unit of a first layer on a substrate;
a step of forming an insulation film of the first layer;
a step of forming a sensor unit of a second layer;
a step of forming an insulation film of the second layer;
a step of forming a sensor unit of a third layer;
a step of forming an insulation film of the third layer;
a step of forming a sensor unit of a fourth layer;
a step of forming an insulation film of the fourth layer; and
a step of performing a heat treatment at a temperature of 200° C. or above but 300° C. or below, wherein
each of the steps of forming the sensor units of the respective layers includes: a step of forming a first ferromagnetic film while applying a predetermined magnetic field; a step of forming an anti-parallel coupling layer on the first ferromagnetic film; a step of forming a second ferromagnetic film on the anti-parallel coupling layer; a step of forming a nonmagnetic intermediate layer on the second ferromagnetic film; a step of forming a soft magnetic free layer on the nonmagnetic intermediate layer; and a step of patterning the sensor unit,
a direction of the magnetic field applied in the steps of forming the sensor units is different from layer to layer; and
the heat treatment is an induced anisotropy vanishing heat treatment for the soft magnetic free layer.

12. The angle sensor manufacturing method according to claim 11, wherein when the direction of the magnetic field applied in the step of forming the sensor unit of the first layer is at an angle of 0°, the directions of the magnetic fields applied in the steps of forming the sensor units of the other layers are 90°, 180° and 270°.

13. The angle sensor manufacturing method according to claim 11, wherein the induced anisotropy vanishing heat treatment is a heat treatment within a rotating magnetic field that is performed while applying a rotating magnetic field of 4 kA/m or above but 40 kA/m or below in an in-plane direction of the substrate.

14. The angle sensor manufacturing method according to claim 11, wherein the induced anisotropy vanishing heat treatment is a heat treatment within substantially zero magnetic field where a magnetic field in an in-plane direction of the substrate is 0.8 kA/m or below.

15. An angle detection device, comprising:
an angle sensor comprising a layered structure in which a plurality of magnetoresistive sensor units are stacked in a film thickness direction with interposed insulation films, wherein each sensor unit comprises: ferromagnetic pinned layer in which a first ferromagnetic film and a second ferromagnetic film are anti-ferromagnetically coupled with an interposed anti-parallel coupling film; a nonmagnetic intermediate layer; and a soft magnetic free layer, wherein the first ferromagnetic film and the second ferromagnetic film have substantially the same Curie temperature and the difference in magnetization amount therebetween is substantially zero, magnetizations of the ferromagnetic pinned layers of the sensor units belonging to the same layer are oriented in the same direction, magnetizations of the ferromagnetic pinned layers of the sensor units belonging to different layers are respectively oriented in different directions, and a bridge circuit that outputs a signal corresponding to an external magnetic field is built by the plurality of sensor units;
a magnet that performs a relative rotary motion relative to the angle sensor;
a rotary shaft which is provided with the angle sensor and which is for performing the rotary motion;
a rotary mechanism in which the magnet rotates around the rotary shaft, and
induced anisotropy of the soft magnetic free layers of the sensor units is made isotropic.

16. A magnetic sensor, comprising:
a layered structure in which a plurality of magnetoresistive sensor units are stacked in a film thickness direction with interposed insulation films, wherein
each sensor unit comprises: a self-pinned type ferromagnetic pinned layer in which a first ferromagnetic film and a second ferromagnetic film are anti-ferromagnetically coupled with an interposed anti-parallel coupling film; a nonmagnetic intermediate layer; and a soft magnetic free layer, wherein the first ferromagnetic film and the second ferromagnetic film have substantially the same Curie temperature and the difference in magnetization amount therebetween is substantially zero, magnetizations of the ferromagnetic pinned layers of the sensor units belonging to different layers are respectively oriented in different directions, a bridge circuit that outputs a signal corresponding to an external magnetic field is built by the plurality of sensor units, and induced anisotropy of the soft magnetic free layers of the sensor units is made isotropic.

* * * * *

UNITED STATES PATENT AND TRADEMARK OFFICE
CERTIFICATE OF CORRECTION

PATENT NO.        : 8,564,282 B2
APPLICATION NO.   : 12/864997
DATED             : October 22, 2013
INVENTOR(S)       : H. Hoshiya et al.

It is certified that error appears in the above-identified patent and that said Letters Patent is hereby corrected as shown below:

ON THE TITLE PAGE

Please correct (75) as follows:

(75) Inventors: Hiroyuki Hoshiya, Odawara (JP);
Kenichi ~~Meguroo~~ Meguro, Kaisei (JP);
Kazuhiro Nakamoto, San Jose, CA;
(US); Yasunori Abe, Nagaokakyo (JP)

Signed and Sealed this
Eleventh Day of February, 2014

Michelle K. Lee
*Deputy Director of the United States Patent and Trademark Office*